(12) United States Patent
Doornbos et al.

(10) Patent No.: US 11,264,498 B2
(45) Date of Patent: Mar. 1, 2022

(54) SEMICONDUCTOR DEVICE AND METHOD OF FABRICATING THE SAME

(71) Applicant: Taiwan Semiconductor Manufacturing Co., Ltd., Hsinchu (TW)

(72) Inventors: Gerben Doornbos, Kessel-Lo (BE); Blandine Duriez, Brussels (BE); Georgios Vellianitis, Heverlee (BE); Marcus Johannes Henricus Van Dal, Linden (BE); Mauricio Manfrini, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/901,004

(22) Filed: Jun. 15, 2020

(65) Prior Publication Data

US 2021/0391469 A1    Dec. 16, 2021

(51) Int. Cl.
*H01L 29/78*    (2006.01)
*H01L 29/66*    (2006.01)
(Continued)

(52) U.S. Cl.
CPC .... *H01L 29/78391* (2014.09); *H01L 27/1159* (2013.01); *H01L 27/11587* (2013.01); *H01L 29/6684* (2013.01)

(58) Field of Classification Search
None
See application file for complete search history.

(56) References Cited

U.S. PATENT DOCUMENTS

| | | | | |
|---|---|---|---|---|
| 5,384,729 A | * | 1/1995 | Sameshima | H01L 27/11502 257/295 |
| 5,937,288 A | * | 8/1999 | Alsmeier | H01L 21/823878 438/221 |

(Continued)

OTHER PUBLICATIONS

Pavan Nukala, et al., "Direct Epitaxial Growth of Polar (1-x)HfO2-(x)ZrO2 Ultrathin Films on Silicon", ACS Applied Electronic Materials, Nov. 25, 2019, 1, pp. 2585-2593.

(Continued)

*Primary Examiner* — Andres Munoz
(74) *Attorney, Agent, or Firm* — JCIPRNET

(57) ABSTRACT

A semiconductor device includes a semiconductor substrate, a first source region, a first drain region, a first gate, a second source region, a second drain region, a second gate, and a first dielectric layer. The first source region and the first drain region are disposed within the semiconductor substrate. The first gate is disposed over the semiconductor substrate in between the first source region and the first drain region. The second source region and the second drain region are disposed within the semiconductor substrate. The second gate is disposed over the semiconductor substrate in between the second source region and the second drain region. The first dielectric layer is located in between the first gate and the semiconductor substrate, and in between the second gate and the semiconductor substrate, wherein the first dielectric layer extends from a position below the first gate to a position below the second gate.

20 Claims, 23 Drawing Sheets

(51) Int. Cl.
*H01L 27/11587* (2017.01)
*H01L 27/1159* (2017.01)

(56) References Cited

U.S. PATENT DOCUMENTS

2019/0131420 A1\* 5/2019 Lu ............... H01L 29/66795
2020/0006359 A1\* 1/2020 Wu ............... H01L 27/1159

OTHER PUBLICATIONS

Simon Fichtner, et al., "AlScN: A lll-V semiconductor based Ferroelectric", Journal of Applied Physics, Mar. 18, 2019, pp. 125, 114103-1-125, 114103-7.

Michael S. Richman, et al., "Ferroelectric system dynamics simulated by a second-order Landau model", Journal ol Applied Physics, Sep. 7, 2017, pp. 1-25.

Abbagari Souleymanou, et al., "The propagation of waves in thin-film ferroelectric materials", Indian Academy of Sciences, Pramana—J. Phys. (May 23, 2019) 93:27, pp. 1-6.

\* cited by examiner

SEMICONDUCTOR DEVICE AND METHOD OF FABRICATING THE SAME

BACKGROUND

Many modern-day electronic devices contain electronic memory configured to store data. Electronic memory may be volatile memory or non-volatile memory. Volatile memory stores data while it is powered, while non-volatile memory is able to store data when power is removed. Non-volatile memory based on ferroelectric field-effect transistor (Fe-FET) are one promising candidate for the next generation non-volatile memory technology. This is because Fe-FET based memory devices provide for many advantages, including a fast write time, high endurance, low power consumption, and low susceptibility to damage from radiation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
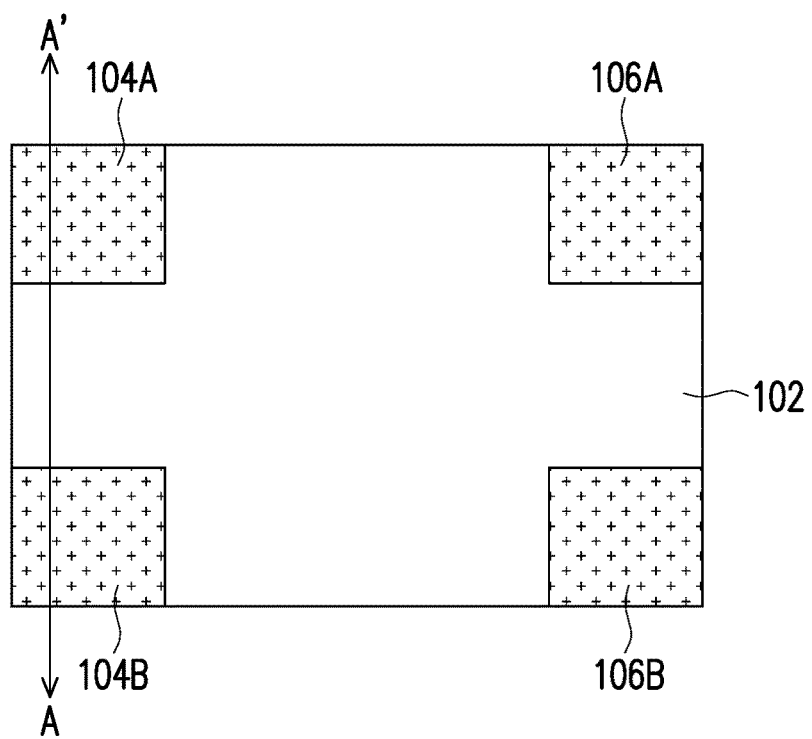
FIG. 1A to FIG. 3D are schematic top views and sectional views of various stages in a method of fabricating a semiconductor device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 3D are schematic top views and sectional views of various stages in a method of fabricating a semiconductor device according to some embodiments of the present disclosure. Embodiments will be described with respect to a specific context, namely a semiconductor device, such as a ferroelectric field-effect transistor (Fe-FET) based memory device. Other embodiments may also be applied, however, to other circuits and layouts. Throughout the various views and illustrative embodiments, like reference numbers are used to designate like elements.

Figure 1B:
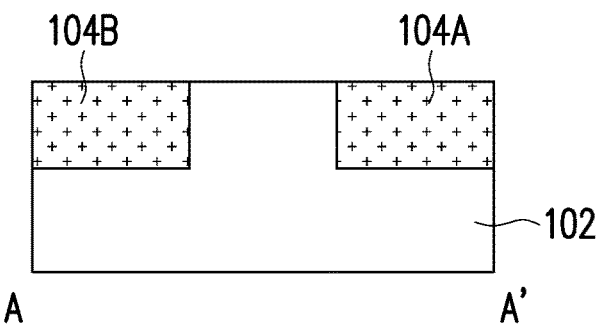

FIG. 1A is a top view of one stage in a method of fabricating a semiconductor device according to some embodiments of the present disclosure. FIG. 1B is a sectional view of the structure shown in FIG. 1A taken along the line A-A'. Referring to FIG. 1A and FIG. 1B, a substrate 102 is provided. The substrate 102 may include a semiconductor wafer, a semiconductor-on-insulator (SOI) wafer or an epitaxial wafer. The substrate 102 may be doped (e.g., with a p-type or an n-type dopant) or undoped. In some exemplary embodiments, the semiconductor wafer, the SOI wafer or the epitaxial wafer include an elemental semiconductor material or a compound semiconductor material. For instance, the elemental semiconductor may include Si or Ge. The compound semiconductor may include SiGe, SiC, SiGeC, a III-V semiconductor or a II-VI semiconductor. For instance, the III-V semiconductor includes GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs or InAlPAs. The II-VI semiconductor may include CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe or HgZnSTe. A material of the substrate 102 is not particularly limited as long as a ferroelectric material layer formed in subsequent steps may be monolithically disposed on the substrate 102.

In some embodiments, the substrate 102 includes a plurality of source (104A, 106A) and drain (104B, 106B) regions. For example, the substrate 102 is doped to form the plurality of source (104A, 106A) and drain (104B, 106B) regions. In the illustrated embodiment, the substrate 102 includes a first source region 104A, a first drain region 104B, a second source region 106A and a second drain region 106B. The first source region 104A, the first drain region 104B, the second source region 106A and the second drain region 106B are disposed within the substrate 102, and being separated from one another.

Figure 2A:
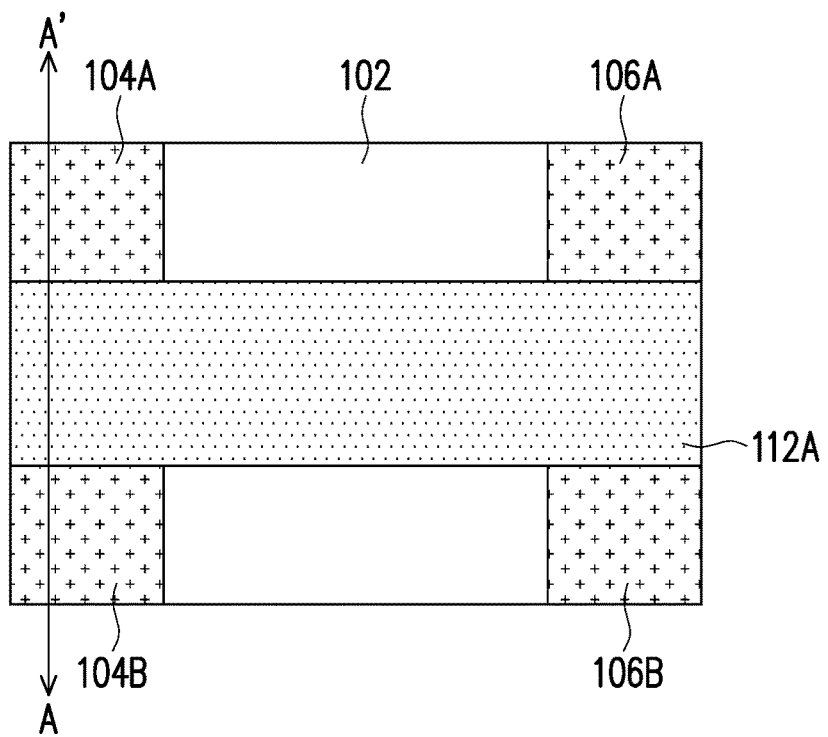
Figure 2B:
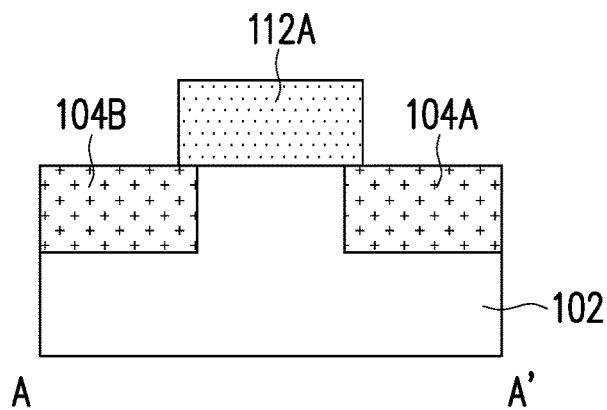

FIG. 2A is a top view of one stage in a method of fabricating a semiconductor device according to some embodiments of the present disclosure. FIG. 2B is a sectional view of the structure shown in FIG. 2A taken along the line A-A'. Referring to FIG. 2A and FIG. 2B, after providing the substrate 102 and forming the plurality of source and drain regions (104A, 106A, 104B, 106B), a first dielectric layer 112A (or first ferroelectric material layer 112A) is formed on the substrate 102. The first dielectric layer 112A may extend across the substrate 102, and is located between the first source region 104A and the first drain region 104B, and located between the second source region 106A and the second drain region 106B.

In some embodiments, the first dielectric layer 112A (or first ferroelectric material layer 112A) includes a single-crystalline ferroelectric material. In other words, the first dielectric layer 112A (or first ferroelectric material layer 112A) is monolithically deposited/formed (i.e. in a single-crystalline manner) on the substrate 102. In various embodiments, the first dielectric layer 112A may include ferroelectric materials such as silicon doped hafnium oxide (Si:$HfO_2$), aluminum scandium nitride (AlScN), hafnium zirconium oxide ($HfZrO_2$), or the like. The type of ferroelectric materials used for the first dielectric layer 112A (or first ferroelectric material layer 112A) is not particularly limited, as long as the ferroelectric material can be deposited on the substrate 102 in a single-crystalline manner. For example, in one embodiment, AlScN can be monolithically deposited on a GaN substrate to form the first dielectric layer 112A. Furthermore, the first dielectric layer 112A may be formed on the substrate 102 through suitable deposition techniques, such as atomic layer deposition (ALD), chemical vapor deposition (CVD), metal organic chemical vapor deposition (MOCVD), plasma enhanced chemical vapor deposition (PECVD), sputtering or the like.

Figure 3A:
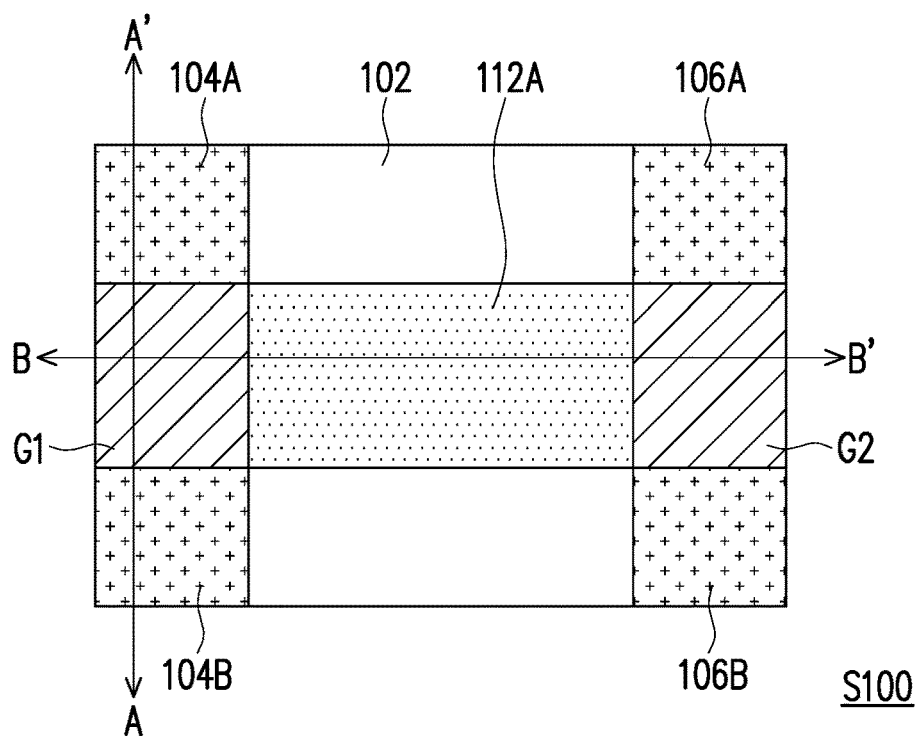
Figure 3B:
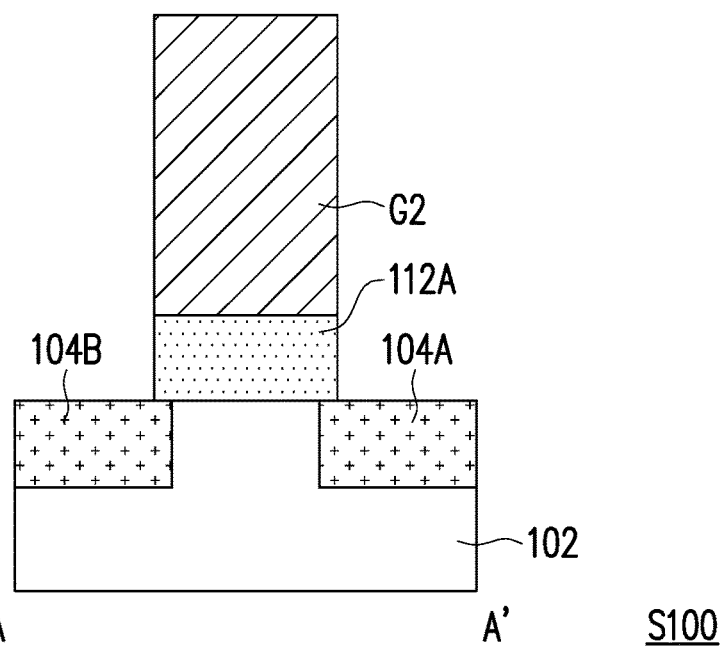
Figure 3C:
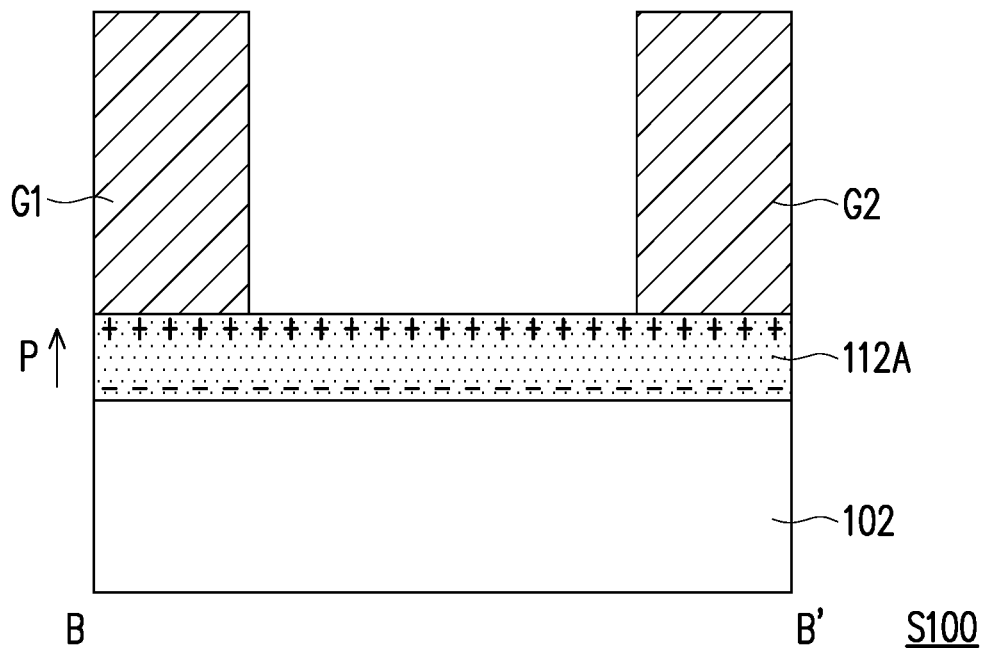
Figure 3D:
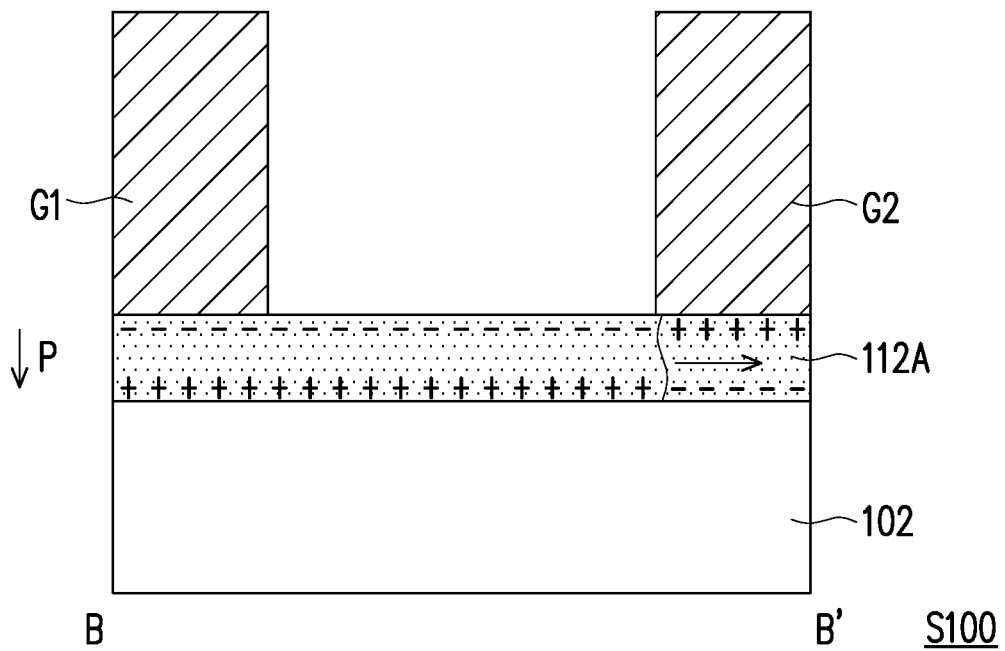

FIG. 3A is a top view of one stage in a method of fabricating a semiconductor device according to some embodiments of the present disclosure. FIG. 3B is a sectional view of the structure shown in FIG. 3A taken along the line A-A'. FIG. 3C and FIG. 3D are sectional views of the structure shown in FIG. 3A taken along the line B-B' under different polarization states.

Referring to FIG. 3A to FIG. 3D, after forming the first dielectric layer 112A (first ferroelectric material layer 112A), a first gate G1 and a second gate G2 are formed on the first dielectric layer 112A. In some embodiments, the formation of the first gate G1 and the second gate G2 includes forming a mask pattern (not shown) with openings, then forming a metallic material (not shown) filling up the openings by electroplating or deposition, and removing the mask pattern to form the first gate G1 and the second gate G2. In certain embodiments, the first gate G1 and the second gate G2 fill into a via opening that reveals the first dielectric layer 112A, so that the first gate G1 and the second gate G2 may be in contact with (physically connected to) the first dielectric layer 112A (first ferroelectric material layer 112A). In some embodiments, the material of the mask pattern may include a positive photo-resist or a negative photo-resist. In one embodiment, the material of the first gate G1 and the second gate G2 may include a metal material such as W, Ti, TiN, TaN, Mo, the like, or combinations thereof. However, the disclosure is not limited thereto.

In some alternative embodiments, the first gate G1 and the second gate G2 are formed by forming a metallic material (not shown) over the substrate 102 and over the first dielectric layer 112A. Thereafter, the metallic material may be patterned to form the first gate G1 and the second gate G2 on the first dielectric layer 112A (first ferroelectric material layer 112A). Although the first gate G1 and the second gate G2 are described as being formed together in the same steps, however, the disclosure is not limited thereto. For example, in alternative embodiments, the second gate G2 is formed after forming the first gate G1 in a different step. After forming the first gate G1 and the second gate G2, a semiconductor device S100 according to some exemplary embodiments of the disclosure is accomplished. In some embodiments, the semiconductor device S100 may be referred as a pass-gate transistor device.

As illustrated in FIG. 3A to FIG. 3D, in the semiconductor device S100, the first gate G1 is disposed on the first dielectric layer 112A in between the first source region 104A and the first drain region 104B (a first transistor), whereas the second gate G2 is disposed on the first dielectric layer 112A in between the second source region 106A and the second drain region 106B (a second transistor). Furthermore, the first dielectric layer 112A is located in between the first gate G1 and the substrate 102, and in between the second gate G2 and the substrate 102. In some embodiments, the first dielectric layer 112A (first ferroelectric material layer 112A) extends from a position below the first gate G1 to a position below the second gate G2. In other words, the first dielectric layer 112A (first ferroelectric material layer 112A) is a continuous layer shared between the first gate G1 and the second gate G2.

In the exemplary embodiment, the first dielectric layer 112A (first ferroelectric material layer) extends from the first gate G1 to the second gate G2 so that a polarization switching function of the first dielectric layer 112A is shared between the first gate G1 and the second gate G2. For example, since the first dielectric layer 112A (first ferroelectric material layer) is deposited on the substrate 102 monolithically (i.e., in a single-crystalline manner), there will be no domain walls in the polarization state of the first dielectric layer 112A due to the absence of polycrystalline grains. As such, after writing "up" (P up) by applying a high negative voltage to the first gate G1 (see FIG. 3C), the "up" polarization (P up) will have extended across the entire first dielectric layer 112A. In a similar way, when subsequently writing "down" (P down) by applying a high positive voltage to the first gate G1 (see FIG. 3D), not only the polarization directly underneath the first gate G1 is flipped, but the "down" polarization (P down) will effectively polarize the entire region (towards the second gate G2); and the domain wall between P "down" and P "up" propagating like a phonon-wave with the speed of sound. In other words, the ferroelectricity may prorogate in the single crystalline material (first dielectric layer 112A) essentially by the speed of sound.

In comparison, if the first dielectric layer 112A is not deposited in a single-crystalline manner, even based on the same ferroelectric materials (e.g. Si:$HfO_2$, AlScN and $HfZrO_2$ etc.), the same polarization switching function cannot be achieved. For example, if the first dielectric layer 112A is deposited in a polycrystalline manner, the polycrystalline grains may include grain boundaries. A propagating domain wall between two different P states cannot pass such grain boundary, and the grain boundary will pin the domain wall, thereby preventing the polarization from spreading to the entire layer.

Furthermore, it should be noted that a polarization of the ferroelectric material is able to change the threshold voltage of the transistor. In other words, in the exemplary embodiment, after switching the polarization by writing P up or P down using the left transistor (the first gate G1), then the threshold voltage of the right transistor (the second gate G2) may be changed. For example, the P up polarization state results in a high threshold voltage, while the P down polarization state results in a low threshold voltage. In the exemplary embodiment, the left transistor (the first gate G1) writes the polarization in one of the two stable states, while the right transistor (the second gate G2) performs read out by detecting a change in the threshold voltage, which in turn depends on the polarization state of the first dielectric layer 112A (first ferroelectric material layer). By using the first dielectric layer 112A (first ferroelectric material layer) for the read/write operation of the semiconductor device S100, fast write and read out times may be achieved.

FIG. 4A to FIG. 5B are schematic top views and sectional views of various stages in a method of fabricating a semiconductor device according to some other embodiments of the present disclosure. The method illustrated in FIG. 4A to FIG. 5B is similar to the method illustrated in FIG. 1A to FIG. 3D. Therefore, the same reference numerals are used to refer to the same or like parts, and its detailed description will not be repeated herein. The difference between the embodiments is that non-active regions are further defined in the substrate 102 in the method illustrated in FIG. 4A to FIG. 5B.

Figure 4A:
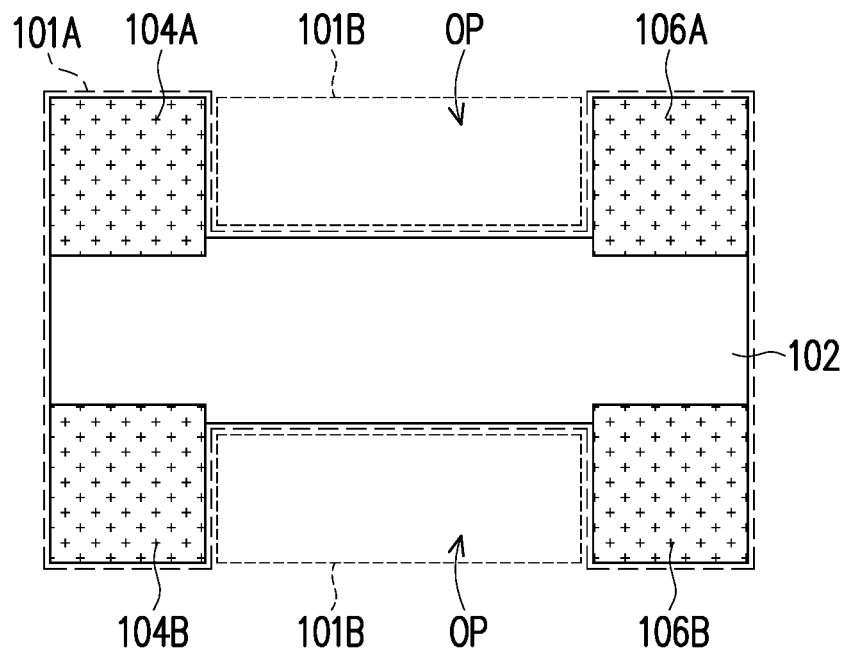
FIG. 4A to FIG. 5B are schematic top views and sectional views of various stages in a method of fabricating a semiconductor device according to some other embodiments of the present disclosure.

As illustrated in FIG. 4A, the substrate 102 may be patterned (or etched) to define active region 101A and non-active regions 101B. For example, the substrate 102 is patterned to form openings OP within the substrate 102 that define the non-active regions 101B and the H-shaped active region 101A. In some embodiments, the active region 101A of the substrate 102 is doped to form a plurality of source and drain regions (104A, 106A, 104B, 106B). For example, the first source region 104A is separated from the second source region 106A by the non-active region 101B, while the first drain region 104B is separated from the second drain region 106B by the non-active region 101B.

Figure 4B:
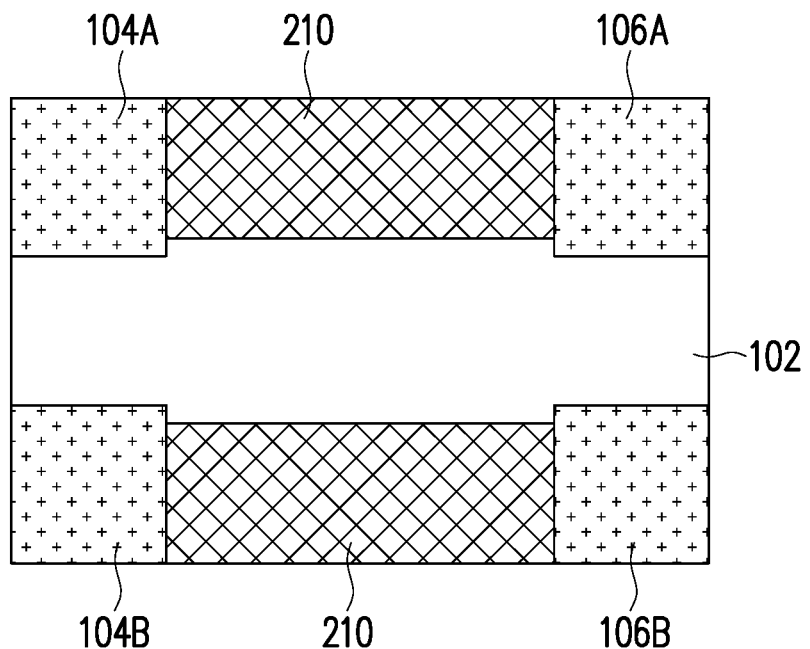

Referring to FIG. 4B, after patterning the substrate 102 to form the openings OP and doping the substrate 102 to form the source and drain regions (104A, 106A, 104B, 106B), a plurality of isolation structures 210 (shallow trench isolation; STI) is formed within the non-active regions 101B of the substrate 102 to fill the openings OP. In the illustrated embodiment, the isolation structures 210 separates the first source region 104A from the second source region 106A, and separates the first drain region 104B from the second drain region 106B. In other words, the source and drain regions (104A, 106A, 104B, 106B) of adjacent transistors are electrically isolated by the isolation structures 210.

Figure 5A:
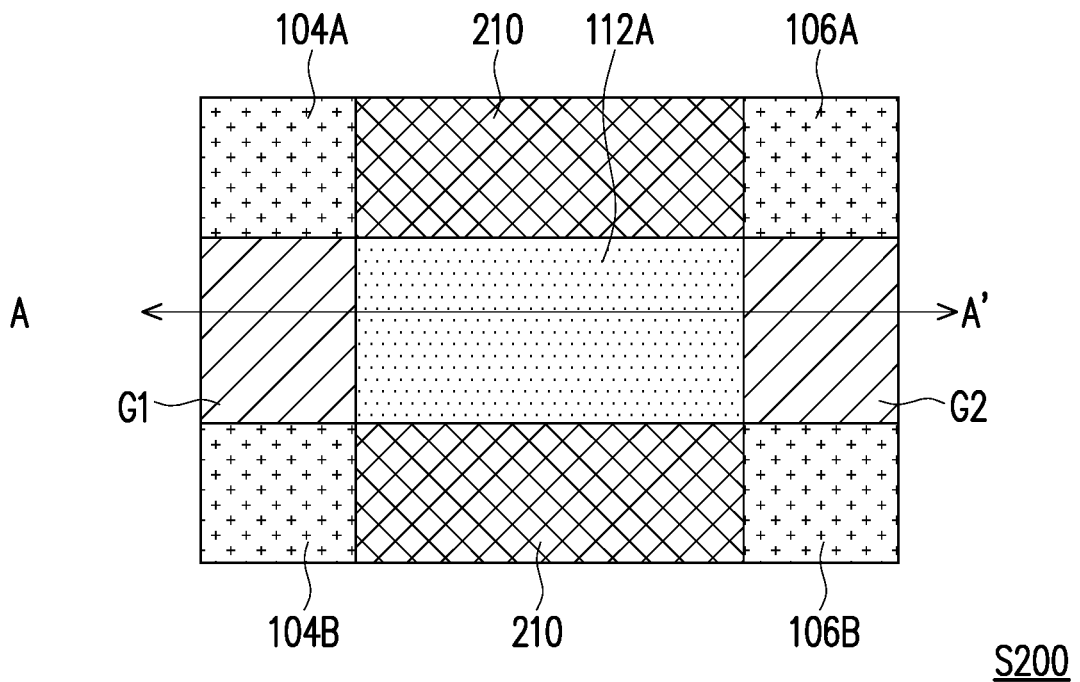
Figure 5B:
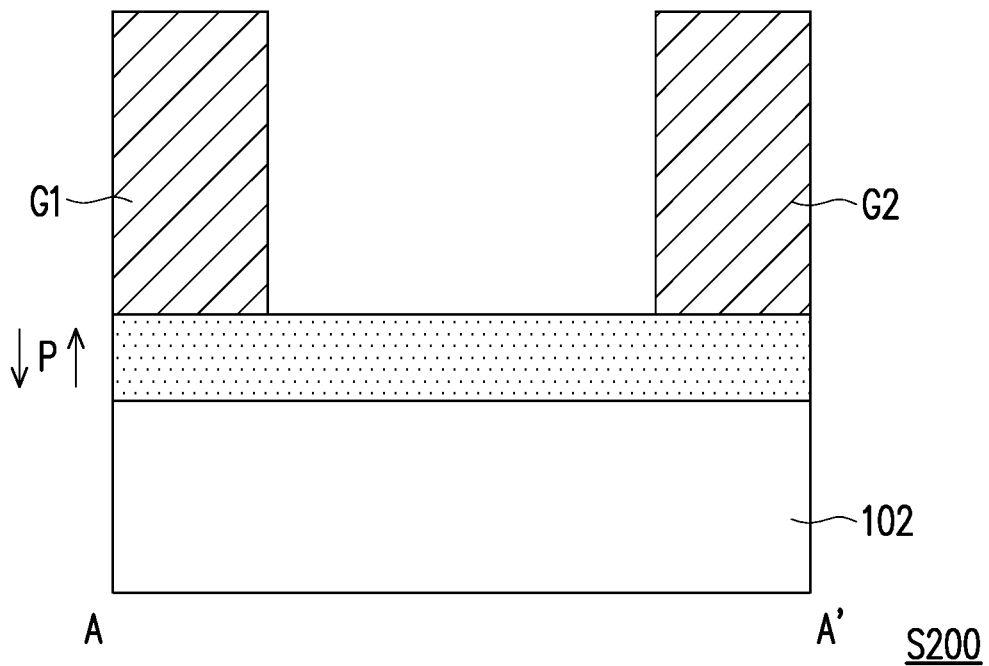

FIG. 5A is a top view of one stage in a method of fabricating a semiconductor device according to some embodiments of the present disclosure. FIG. 5B is a sectional view of the structure shown in FIG. 5A taken along the line A-A'. Referring to FIG. 5A and FIG. 5B, after forming the isolation structures 210, the same steps described in FIG. 2A to FIG. 3B may be performed to form the first dielectric layer 112A (or first ferroelectric material layer 112A) on the active region 101A of the substrate 102, and to form the first gate G1 and the second gate G1 on the first dielectric layer 112A. After forming the first gate G1 and the second gate G2, a semiconductor device S200 according to some exemplary embodiments of the disclosure is accomplished. In the semiconductor device S200 of the illustrated embodiment, the first dielectric layer 112A (first ferroelectric material layer) extends from the first gate G1 to the second gate G2 so that a polarization switching function of the first dielectric layer 112A is shared between the first gate G1 and the second gate G2. As such, by using the first dielectric layer 112A (first ferroelectric material layer) for the read/write operation of the semiconductor device S200, fast write and read out times may be achieved.

FIG. 6A to FIG. 10B are schematic top views and sectional views of various stages in a method of fabricating a semiconductor device according to some other embodiments of the present disclosure. The method illustrated in FIG. 6A to FIG. 10B is similar to the method illustrated in FIG. 1A to FIG. 3D. Therefore, the same reference numerals are used to refer to the same or like parts, and its detailed description will not be repeated herein.

Figure 6A:
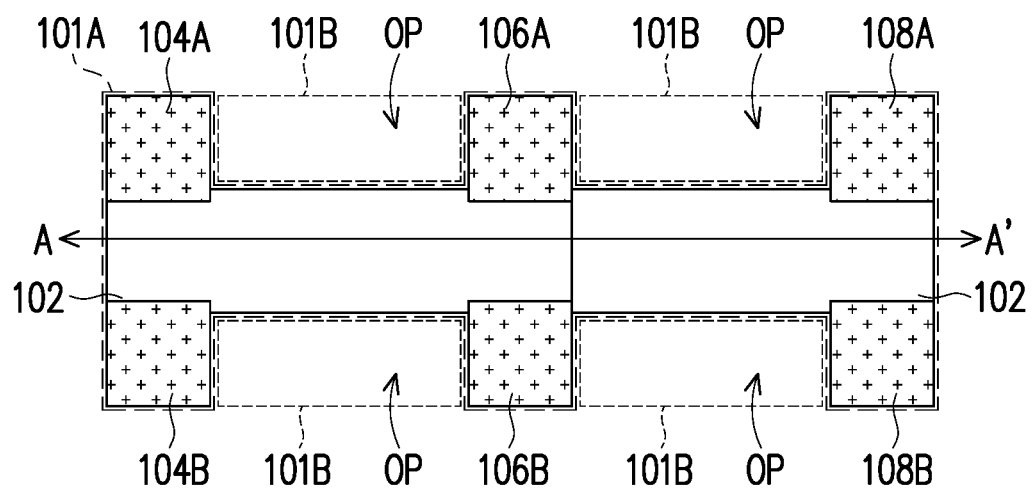
FIG. 6A to FIG. 10B are schematic top views and sectional views of various stages in a method of fabricating a semiconductor device according to some other embodiments of the present disclosure.
Figure 6B:
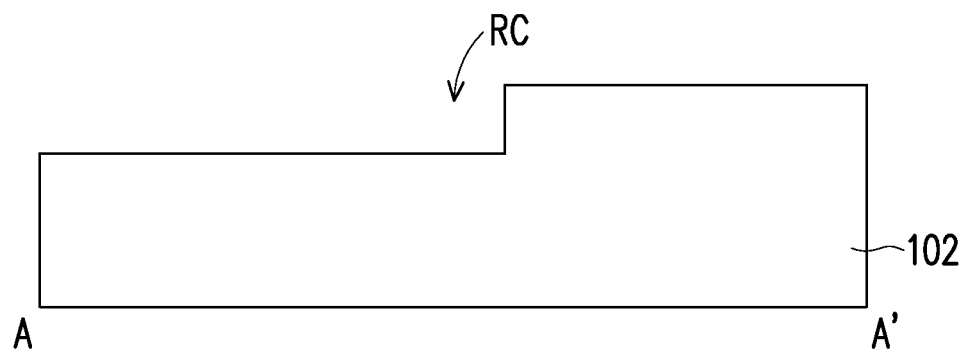

FIG. 6A is a top view of one stage in a method of fabricating a semiconductor device according to some embodiments of the present disclosure. FIG. 6B is a sectional view of the structure shown in FIG. 6A taken along the line A-A'. Referring to FIG. 6A and FIG. 6B, in some embodiments, the substrate 102 is patterned (or etched) to define active region 101A and non-active regions 101B. For example, the substrate 102 is patterned to form openings OP within the substrate 102 that define the non-active regions 101B and the active region 101A. Furthermore, in some embodiments, a height of some portions of the substrate 102 is reduced to form a recessed portion Rc. The height of the substrate 102 may be reduced by suitable techniques such as through patterning/etching techniques, or the like.

Figure 7:
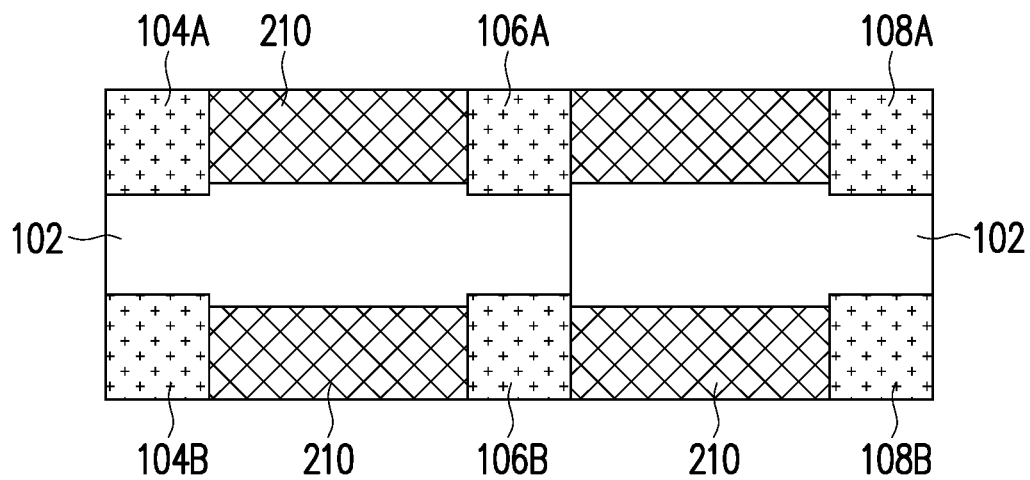

Referring to FIG. 7, after patterning the substrate 102 to form the openings OP, the active region 101A of the substrate 102 is doped to form the plurality of source (104A, 106A, 108A) and drain (104B, 106B, 108B) regions. In the illustrated embodiment, the substrate 102 includes a first source region 104A, a first drain region 104B, a second source region 106A, a second drain region 106B, a third source region 108A and a third drain region 108B. In some embodiments, after doping the substrate 102, a plurality of isolation structures 210 (shallow trench isolation; STI) is formed within the non-active regions 101B of the substrate 102 to fill the openings OP. In the illustrated embodiment, the isolation structures 210 separate the first source region 104A, the second source region 106A and the third source region 108A from one another, and separate the first drain region 104B, the second drain region 106B and the third drain region 108B from one another. In other words, the source and drain regions (104A, 106A, 108A, 104B, 106B, 108B) of adjacent transistors are electrically isolated by the isolation structures 210.

Figure 8A:
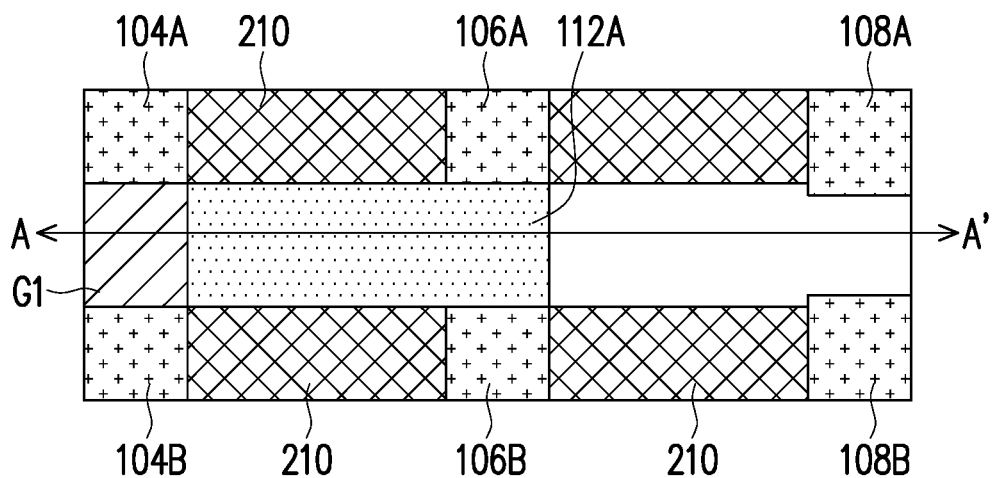
Figure 8B:
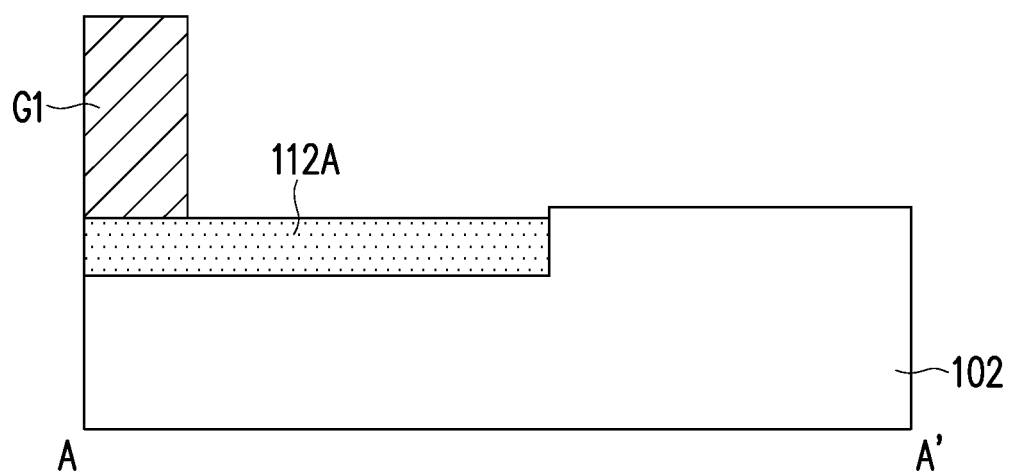

FIG. 8A is a top view of one stage in a method of fabricating a semiconductor device according to some embodiments of the present disclosure. FIG. 8B is a sectional view of the structure shown in FIG. 8A taken along the line A-A'. Referring to FIG. 8A and FIG. 8B, after forming the isolation structures 210, a first dielectric layer 112A (or first ferroelectric material layer 112A) is formed on the recessed portion Rc of the substrate 102 in the active region 101A (shown in FIG. 6A). In some embodiments, the first dielectric layer 112A is monolithically deposited/formed (i.e. in a single-crystalline manner) on the substrate 102 and is in physical contact with the substrate 102. The first dielectric layer 112A may extend across the substrate 102, and is located between the first source region 104A and the first drain region 104B, and located between the second source region 106A and the second drain region 106B. After forming the first dielectric layer 112A, a first gate G1 is formed on the first dielectric layer 112A to be in contact with the first dielectric layer 112A. Furthermore, the first gate G1 is disposed on the substrate 102 in between the first source region 104A and the first drain region 104B to form a first transistor.

Figure 9A:
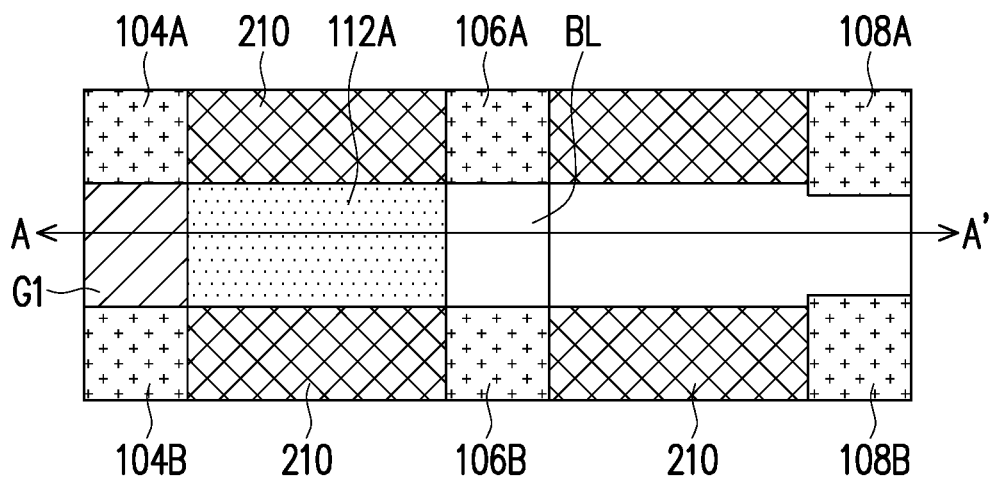
Figure 9B:
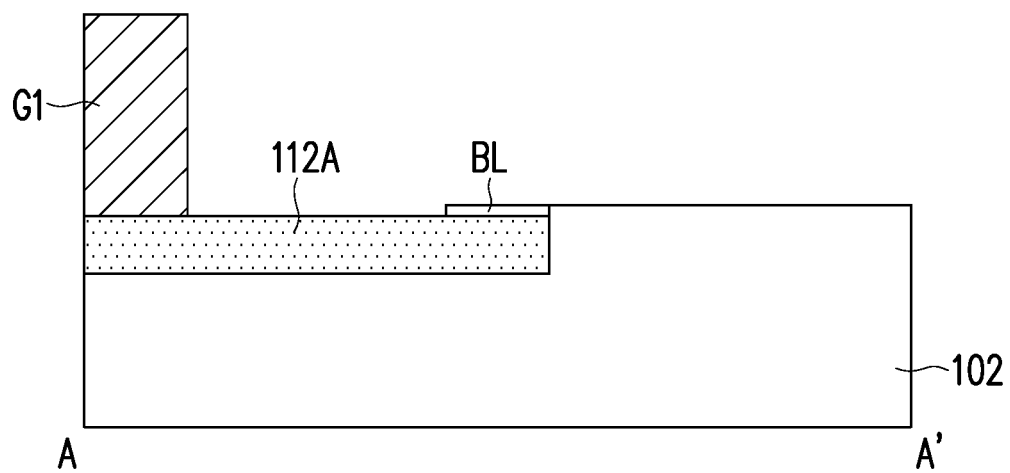

FIG. 9A is a top view of one stage in a method of fabricating a semiconductor device according to some embodiments of the present disclosure. FIG. 9B is a sectional view of the structure shown in FIG. 9A taken along the line A-A'. Referring to FIG. 9A and FIG. 9B, after forming the first dielectric layer 112A and the first gate G1, a barrier layer BL is formed on the first dielectric layer 112A to cover portions of the first dielectric layer 112A. In some embodiments, the barrier layer BL is a non-ferroelectric barrier layer. In the exemplary embodiment, the barrier layer BL prevents the polarization in the first dielectric layer 112A (first ferroelectric material layer 112A) from extending into another ferroelectric material layer. Therefore, a non-ferroelectric material is used as the barrier layer BL. In certain embodiments, the barrier layer BL may include non-ferroelectric materials such as aluminum nitride (AlN), hafnium oxide ($HfO_2$), zirconium oxide ($ZrO_2$), aluminum oxide ($Al_2O_3$), silicon nitride ($Si_3N_4$), silicon oxide ($SiO_2$), or the like. Furthermore, the barrier layer BL may be formed on the first dielectric layer 112A through suitable deposition techniques, such as atomic layer deposition (ALD), chemical vapor deposition (CVD), metal organic chemical vapor deposition (MOCVD), plasma enhanced chemical vapor deposition (PECVD), sputtering or the like. In some embodiments, the barrier layer BL may be formed on the first dielectric layer 112A so that a top surface of the barrier layer BL is coplanar with a top surface of the substrate 102.

Figure 10A:
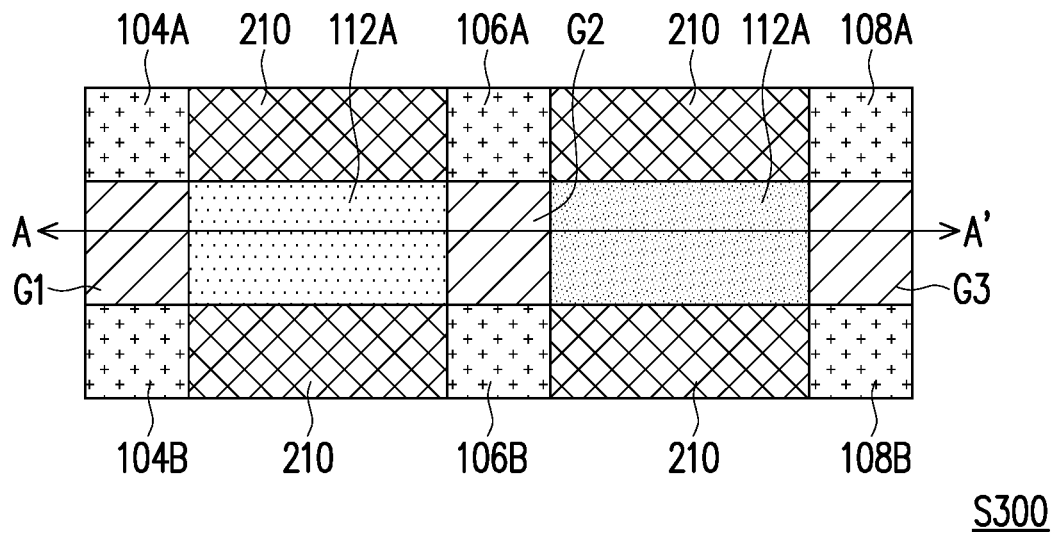
Figure 10B:
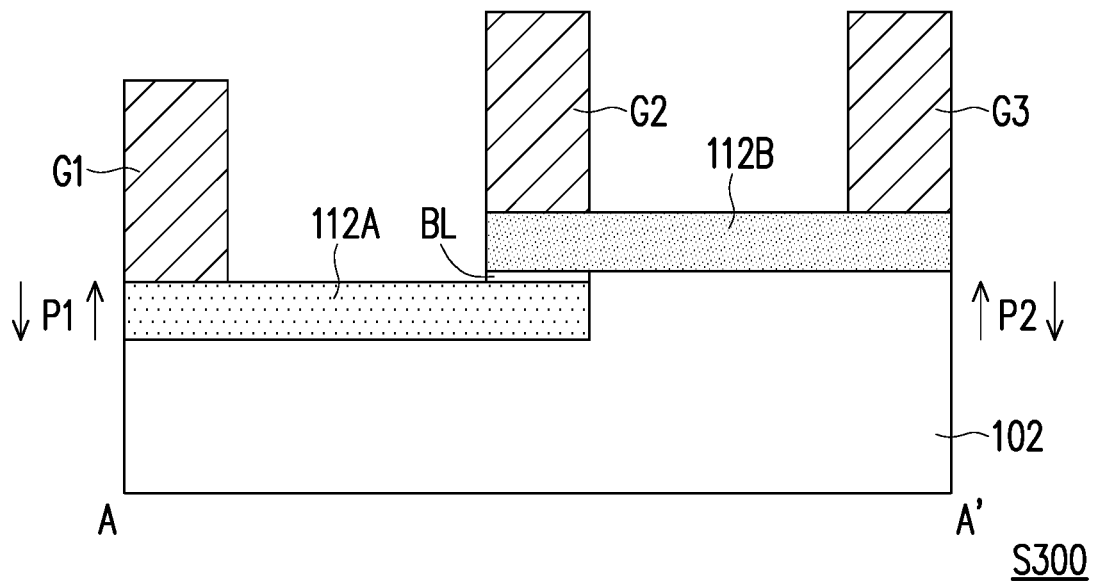

FIG. 10A is a top view of one stage in a method of fabricating a semiconductor device according to some embodiments of the present disclosure. FIG. 10B is a sectional view of the structure shown in FIG. 10A taken along the line A-A'. Referring to FIG. 10A and FIG. 10B, after forming the barrier layer BL, a second dielectric layer 112B (or second ferroelectric material layer 112B) is formed on the barrier layer BL and over the substrate 102. The second dielectric layer 112B may extend across the substrate 102, and is located between the second source region 106A and the second drain region 106B, and located between the third source region 108A and the third drain region 108B. In some embodiments, the second dielectric layer 112B is overlapped with the first dielectric layer 112A and overlapped with the barrier layer BL. In certain embodiments, the barrier layer BL physically separates the first dielectric layer 112A from the second dielectric layer 112B. In other words, the barrier layer BL prevents the polarization (P1 up or P1 down) in the first dielectric layer 112A and the polarization of the second dielectric layer 112B (P2 up or P2 down) from extending into one another.

In some embodiments, the second dielectric layer 112B (or second ferroelectric material layer 112B) includes a single-crystalline ferroelectric material. In other words, the second dielectric layer 112B (or second ferroelectric material layer 112B) is monolithically deposited/formed (i.e. in a single-crystalline manner) on the substrate 102. In various embodiments, the second dielectric layer 112B may include ferroelectric materials such as silicon doped hafnium oxide (Si:$HfO_2$), aluminum scandium nitride (AlScN), hafnium zirconium oxide ($HfZrO_2$), or the like. The type of ferroelectric materials used for the second dielectric layer 112B (or second ferroelectric material layer 112B) is not particularly limited, as long as the ferroelectric material can be deposited on the substrate 102 in a single-crystalline manner. Furthermore, the second dielectric layer 112B may be formed on the substrate 102 through suitable deposition techniques, such as atomic layer deposition (ALD), chemical vapor deposition (CVD), metal organic chemical vapor deposition (MOCVD), plasma enhanced chemical vapor deposition (PECVD), sputtering or the like.

In one embodiment, a material of the second dielectric layer 112B is the same as a material of the first dielectric layer 112A. For example, in some embodiments, the first dielectric layer 112A (first ferroelectric material layer) and the second dielectric layer 112B (second ferroelectric material layer) are aluminum scandium nitride (AlScN) layers, whereas the barrier layer BL separating the first dielectric layer 112A from the second dielectric layer 112B is an aluminum nitride (AlN) layer. In some other embodiments, the first dielectric layer 112A (first ferroelectric material layer) and the second dielectric layer 112B (second ferroelectric material layer) are hafnium zirconium oxide ($HfZrO_2$) layers, whereas the barrier layer BL separating the first dielectric layer 112A from the second dielectric layer 112B is a hafnium oxide ($HfO_2$) or zirconium oxide ($ZrO_2$) layer. However, the disclosure is not limited thereto. In some alternative embodiments, a material of the second dielectric layer 112B is different from a material of the first dielectric layer 112A. Furthermore, in some embodiments, when the first dielectric layer 112A and the second dielectric layer 112B are ferroelectric materials such as silicon doped hafnium oxide (Si:$HfO_2$), the doping concentrations in the first dielectric layer 112A and the second dielectric layer 112B may be the same or different. In some embodiments, a thickness of the first dielectric layer 112A is the same as a thickness of the second dielectric layer 112B. However, the disclosure is not limited thereto. In alternative embodiments, a thickness of the first dielectric layer 112A is different from a thickness of the second dielectric layer 112B.

As illustrated in FIG. 10A and FIG. 10B, after forming the second dielectric layer 112B (or second ferroelectric material layer 112B), a second gate G2 is formed along with a third gate G3 over the second dielectric layer 112B (or second ferroelectric material layer 112B). A method of forming the second gate G2 and the third gate G3 is the same as the method of forming the first gate G1 and the second gate G2 as described in FIG. 3A to FIG. 3D. Therefore, its detailed description is omitted herein. Furthermore, a material of the second gate G2 and the third gate G3 may be similar to a material of the first gate G1. After forming the second gate G2 and the third gate G3, a semiconductor device S300 according to some exemplary embodiments of the disclosure is accomplished. In some embodiments, the semiconductor device S300 may be referred as a one-bit adder transistor device.

In the semiconductor device S300 of the illustrated embodiment, the first gate G1 is disposed on the first dielectric layer 112A in between the first source region 104A and the first drain region 104B (a first transistor), the second gate G2 is disposed on the first dielectric layer 112A and the second dielectric layer 112B in between the second source region 106A and the second drain region 106B (a second transistor), whereas the third gate G3 is disposed on the second dielectric layer 112B in between the third source region 108A and the third drain region 108B (a third transistor). In some embodiments, the first dielectric layer 112A (first ferroelectric material layer 112A) extends from a position below the first gate G1 to a position below the second gate G2. In other words, the first dielectric layer 112A (first ferroelectric material layer 112A) is a continuous layer shared between the first gate G1 and the second gate G2. Furthermore, the second dielectric layer 112B (second ferroelectric material layer 112B) extends from a position below the third gate G3 to a position below the second gate G2. In other words, the second dielectric layer 112B (second ferroelectric material layer 112B) is a continuous layer shared between the third gate G3 and the second gate G2.

In the exemplary embodiment, the first dielectric layer 112A (first ferroelectric material layer) extends from the first gate G1 to the second gate G2 so that a polarization switching function of the first dielectric layer 112A is shared between the first gate G1 and the second gate G2. Furthermore, the second dielectric layer 112B (second ferroelectric material layer 112B) extends from the third gate G3 to the second gate G2 so that a polarization switching function of the second dielectric layer 112B is shared between the third gate G3 and the second gate G2. In some embodiment, the first transistor (with the first gate G1) writes the polarization of the first dielectric layer 112A in one of the two stable states (P1 up or P1 down), while the third transistor (with the third gate G3) writes the polarization of the second dielectric layer 112B in one of the two stable states (P2 up or P2 down). Furthermore, the second transistor (with the second gate G2) reads out a sum of the polarizations of the first dielectric layer 112A and the second dielectric layer 112B to detect a change in the threshold voltage.

In the exemplary embodiments, the semiconductor device S300 can be used to store at least three different states. For example, a first state is where the polarization of the first and second dielectric layers 112A, 112B are both written "down" (P1 down and P2 down) resulting in a first threshold voltage; a second state is where the polarization of the first and second dielectric layers 112A, 112B are both written "up" (P1 up and P2 up) resulting in a second threshold voltage; and a third state is where one of the first and second dielectric layers 112A, 112B is written "up", while the other one is written "down" ("P1 up and P2 down", or "P1 down and P2 up"), resulting in a third threshold voltage. The third state relates to a case where the first and second dielectric layers 112A, 112B are made of the same material and have the same thicknesses so "P1 up and P2 down", or "P1 down and P2 up" result in the same threshold voltage. In another case where the first and second dielectric layers 112A, 112B are made of different materials, or have different thicknesses, or are made of same materials but with different doping concentration, then even four states can be stored ("P1 up and P2 down" and "P1 down and P2 up" result in different threshold voltages). By using the first dielectric layer 112A (first ferroelectric material layer) and the second dielectric layer 112B (second ferroelectric material layer 112B) for the read/write operation of the semiconductor device S300, fast write and read out times may be achieved.

Figure 11:
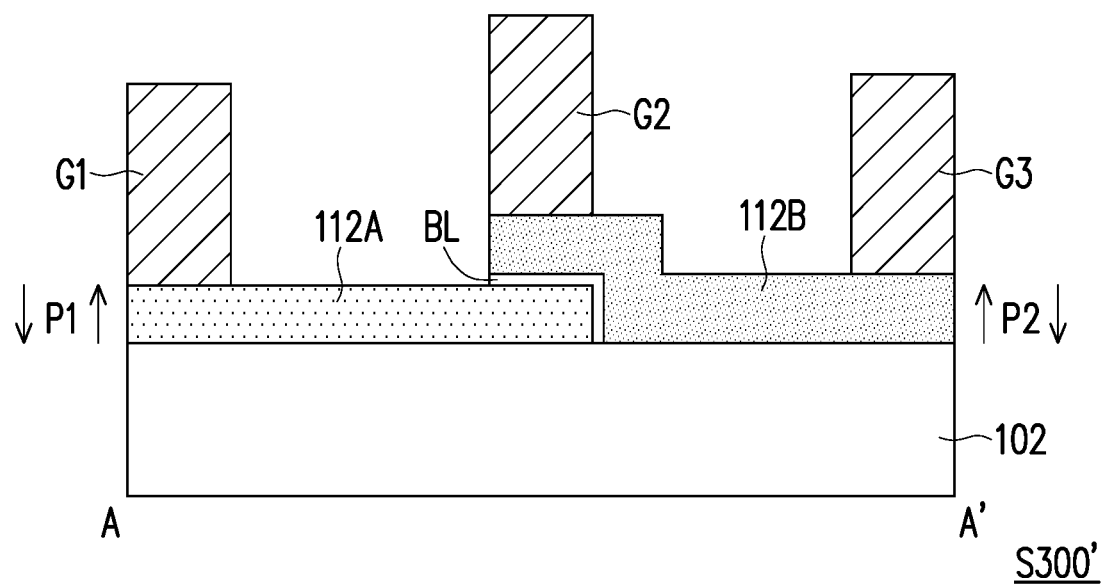
FIG. 11 is a sectional view of a semiconductor device according to some other embodiments of the present disclosure.

FIG. 11 is a sectional view of a semiconductor device according to some other embodiments of the present disclosure. The semiconductor device S300' illustrated in FIG. 11 is similar to the semiconductor device S300 illustrated in FIG. 12A and FIG. 12B. Therefore, the same reference numerals are used to refer to the same or liked parts, and its detailed description is omitted herein. In the previous embodiments, the substrate 102 may be recessed to from a recessed portion Rc, whereby the first dielectric layer 112A is formed in the recessed portion Rc of the substrate 102. However, the disclosure is not limited thereto. For example, as illustrated in FIG. 11, in some embodiments, the substrate 102 is not recessed, and the first dielectric layer 112A, the barrier layer BL and the second dielectric layer 112B may be sequentially formed over the planar substrate 102. In other words, the barrier layer BL is conformally formed over portions of the first dielectric layer 112A and is in physical contact with the first dielectric layer 112A and the substrate 102. Furthermore, the second dielectric layer 112B is conformally formed over the barrier layer BL and the substrate 102, and is in physical contact with the barrier layer BL and the substrate 102. Similar to the above embodiments, by using the first dielectric layer 112A (first ferroelectric material layer) and the second dielectric layer 112B (second ferroelectric material layer 112B) for the read/write operation of the semiconductor device S300', fast write and read out times may be achieved.

FIG. 12A to FIG. 17C are schematic top views and sectional views of various stages in a method of fabricating a semiconductor device according to some other embodiments of the present disclosure. The method illustrated in FIG. 12A to FIG. 17C is similar to the method illustrated in FIG. 6A to FIG. 10B. Therefore, the same reference numerals are used to refer to the same or like parts, and its detailed description will not be repeated herein.

Figure 12A:
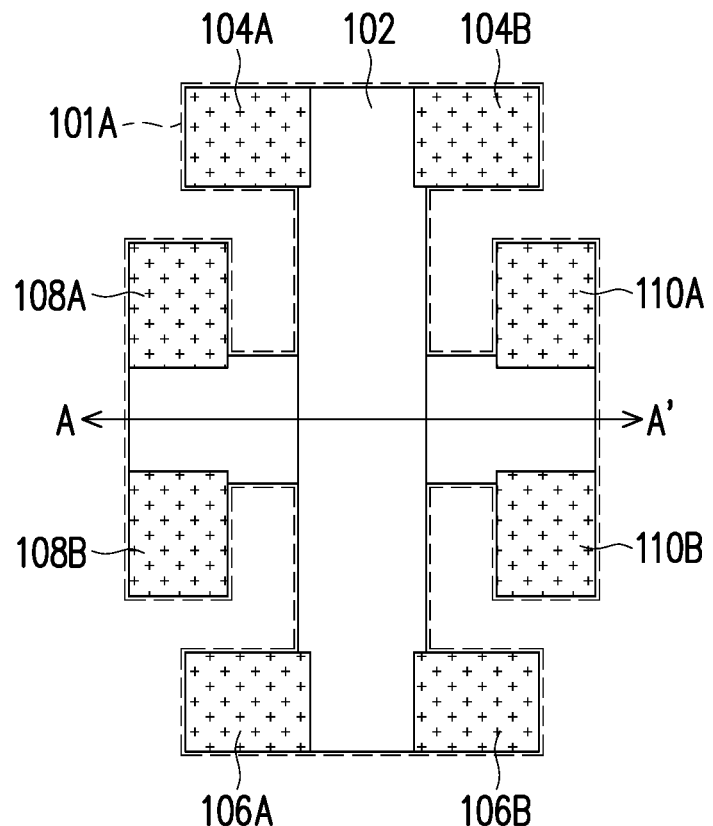
FIG. 12A to FIG. 17C are schematic top views and sectional views of various stages in a method of fabricating a semiconductor device according to some other embodiments of the present disclosure.
Figure 12B:
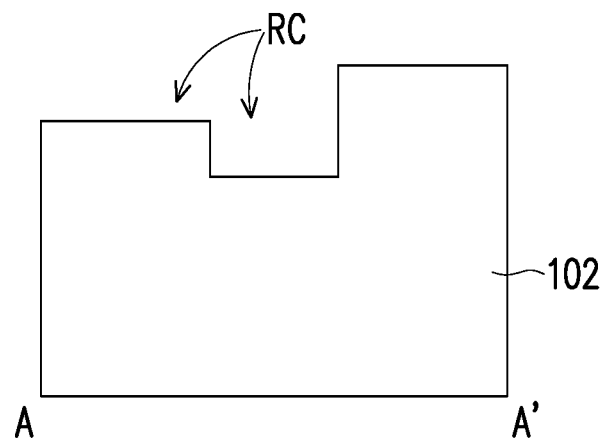

FIG. 12A is a top view of one stage in a method of fabricating a semiconductor device according to some embodiments of the present disclosure. FIG. 12B is a sectional view of the structure shown in FIG. 12A taken along the line A-A'. Referring to FIG. 12A and FIG. 12B, in some embodiments, the substrate 102 is patterned (or etched) to define active region 101A and non-active regions (omitted for ease of illustration). Furthermore, in some embodiments, a height of some portions of the substrate 102 is reduced to form recessed portions Rc. The height of the substrate 102 may be reduced by suitable techniques such as through patterning/etching techniques, or the like.

As illustrated in FIG. 12A, the active region 101A of the substrate 102 is doped to form the plurality of source (104A, 106A, 108A, 110A) and drain (104B, 106B, 108B, 110B) regions. In the illustrated embodiment, the substrate 102 includes a first source region 104A, a first drain region 104B, a second source region 106A, a second drain region 106B, a third source region 108A, a third drain region 108B, a fourth source region 110A and a fourth drain region 110B. The non-active regions of the substrate 102 may be suitably formed with isolation structures (not shown) to separate the source and drain regions (104A, 106A, 108A, 110A, 104B, 106B, 108B, 110B) of adjacent transistors if required.

Figure 13A:
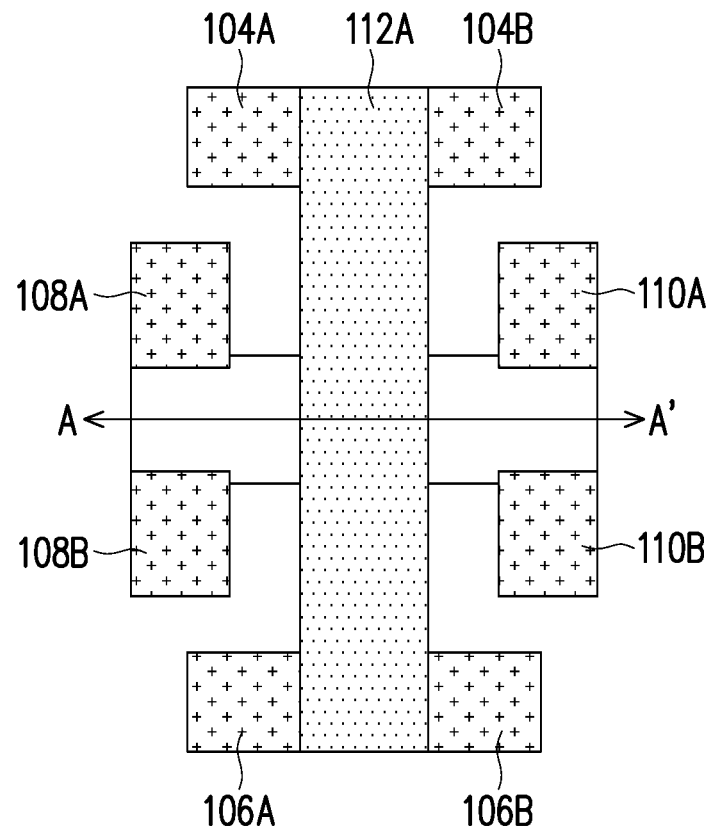
Figure 13B:
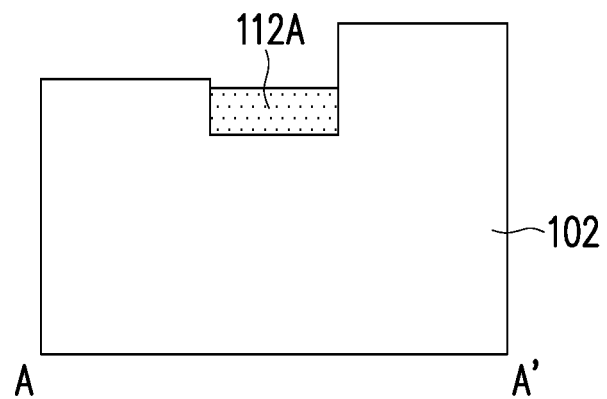

FIG. 13A is a top view of one stage in a method of fabricating a semiconductor device according to some embodiments of the present disclosure. FIG. 13B is a sectional view of the structure shown in FIG. 13A taken along the line A-A'. Referring to FIG. 13A and FIG. 13B, a first dielectric layer 112A (or first ferroelectric material layer 112A) is formed on the recessed portion Rc of the substrate 102 in the active region 101A (shown in FIG. 12A). In some embodiments, the first dielectric layer 112A is monolithically deposited/formed (i.e. in a single-crystalline manner) on the substrate 102 and is in physical contact with the substrate 102. The first dielectric layer 112A may extend across the substrate 102, and is located between the first source region 104A and the first drain region 104B, and located between the second source region 106A and the second drain region 106B.

Figure 14A:
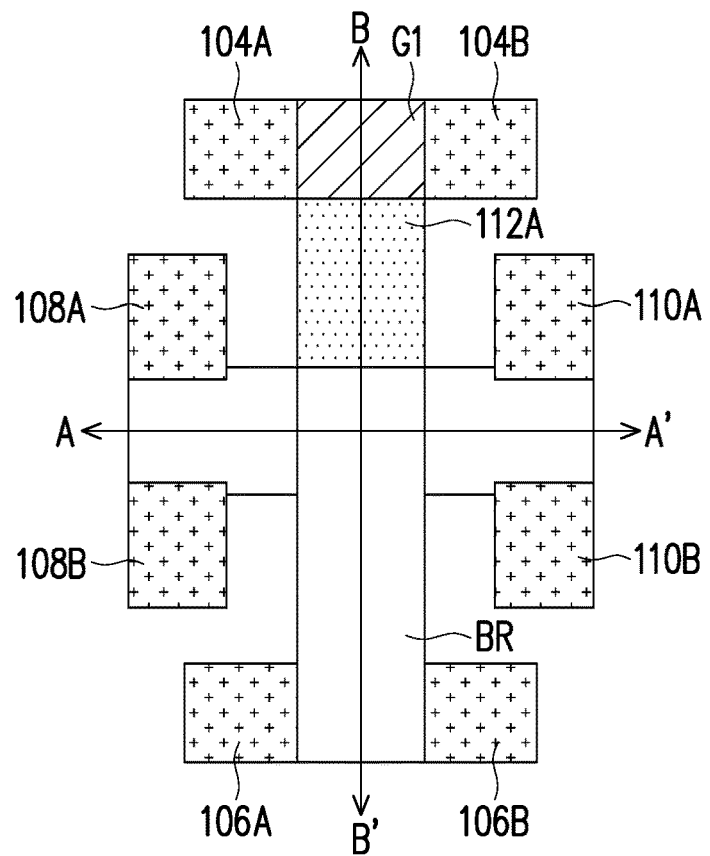
Figure 14B:
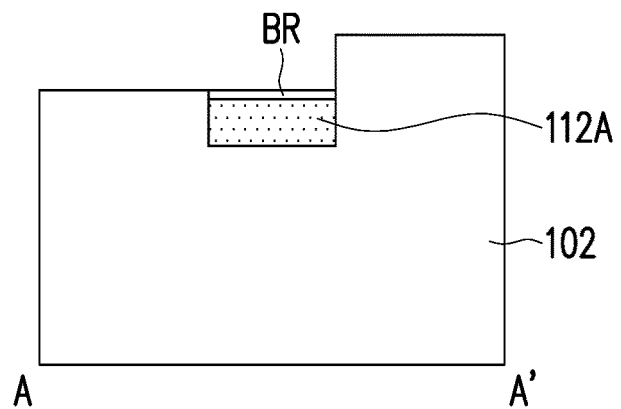
Figure 14C:
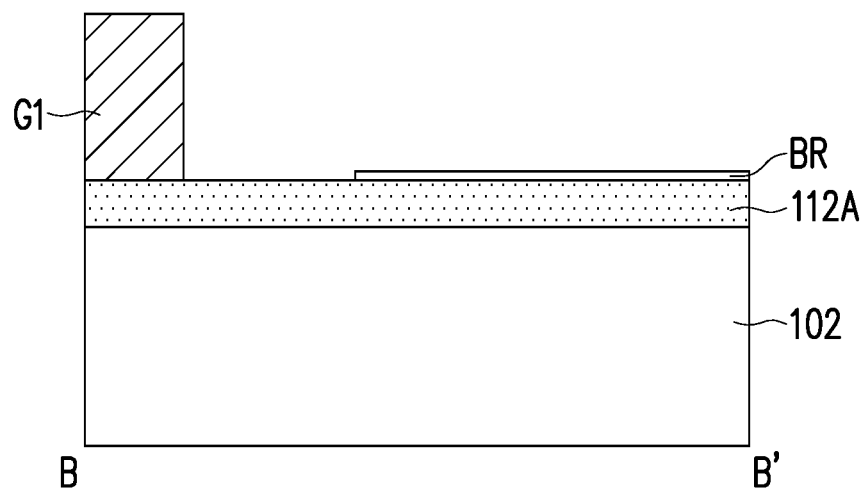

FIG. 14A is a top view of one stage in a method of fabricating a semiconductor device according to some embodiments of the present disclosure. FIG. 14B is a sectional view of the structure shown in FIG. 14A taken along the line A-A'. FIG. 14C is a sectional view of the structure shown in FIG. 14A taken along the line B-B'. Referring to FIG. 14A to FIG. 14C, after forming the first dielectric layer 112A, a first gate G1 is formed on the first dielectric layer 112A to be in contact with the first dielectric layer 112A. Furthermore, the first gate G1 is disposed on the substrate 102 in between the first source region 104A and the first drain region 104B to form a first transistor. Thereafter, a barrier layer BR (first barrier layer) is formed on the first dielectric layer 112A to cover portions of the first dielectric layer 112A. In some embodiments, the barrier layer BR is a non-ferroelectric barrier layer. In the exemplary embodiment, the barrier layer BR prevents the polarization in the first dielectric layer 112A (first ferroelectric material layer 112A) from extending into another ferroelectric material layer. The barrier layer BR may be similar to the barrier layer BL described in previous embodiments, thus its detailed description is omitted herein.

Figure 15A:
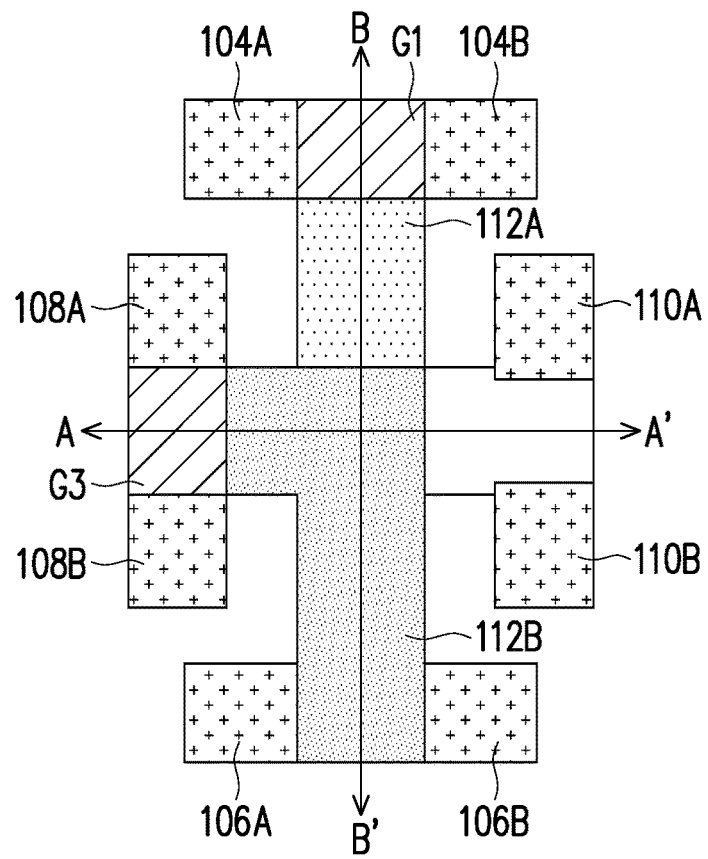
Figure 15B:
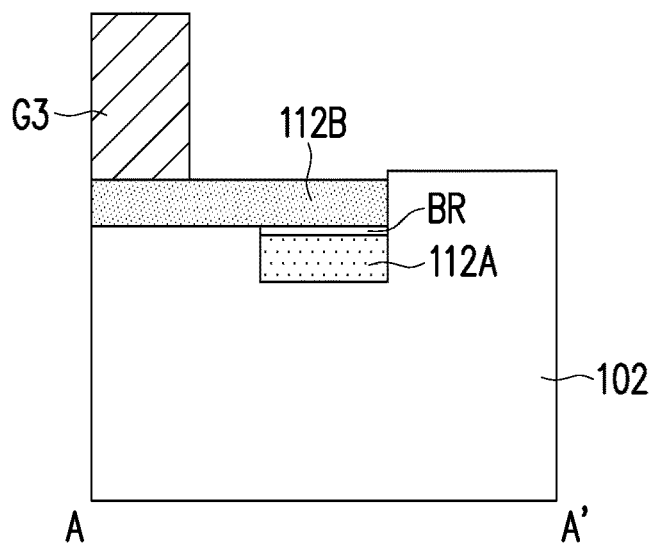
Figure 15C:
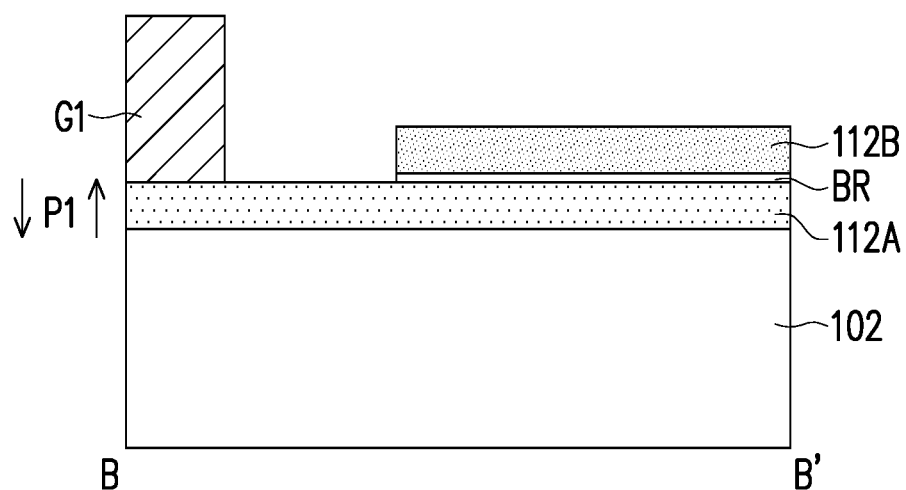

FIG. 15A is a top view of one stage in a method of fabricating a semiconductor device according to some embodiments of the present disclosure. FIG. 15B is a sectional view of the structure shown in FIG. 15A taken along the line A-A'. FIG. 15C is a sectional view of the structure shown in FIG. 15A taken along the line B-B'. Referring to FIG. 15A to FIG. 15C, after forming the first dielectric layer 112A and the first gate G1, a second dielectric layer 112B (or second ferroelectric material layer 112B) is formed on the barrier layer BR and in the recessed portion Re of the substrate 102. In some embodiments, the second dielectric layer 112B is monolithically deposited/formed (i.e. in a single-crystalline manner) on the substrate 102 and is in physical contact with the substrate 102 and the barrier layer BR. The second dielectric layer 112B may extend across the substrate 102, and is located between the second source region 106A and the second drain region 106B, and located between the third source region 108A and the third drain region 108B. In some embodiments, the second dielectric layer 112B is arranged in a L-shaped manner when seen from the top view. In some embodiments, the second dielectric layer 112B is overlapped with the first dielectric layer 112A and overlapped with the barrier layer BR. In certain embodiments, the barrier layer BR physically separates the first dielectric layer 112A from the second dielectric layer 112B. In other words, the barrier layer BR prevents the polarization in the first dielectric layer 112A and the polarization of the second dielectric layer 112B from extending into one another.

After forming the second dielectric layer 112B (or second ferroelectric material layer 112B), a third gate G3 is formed over the second dielectric layer 112B (or second ferroelectric material layer 112B). For example, the third gate G3 is located between the third source region 108A and the third drain region 108B. A method of forming the third gate G3 is the same as the method of forming the first gate G1 as described in previous embodiments. Therefore, its detailed description is omitted herein. Furthermore, a material of the third gate G3 may be similar to a material of the first gate G1.

Figure 16A:
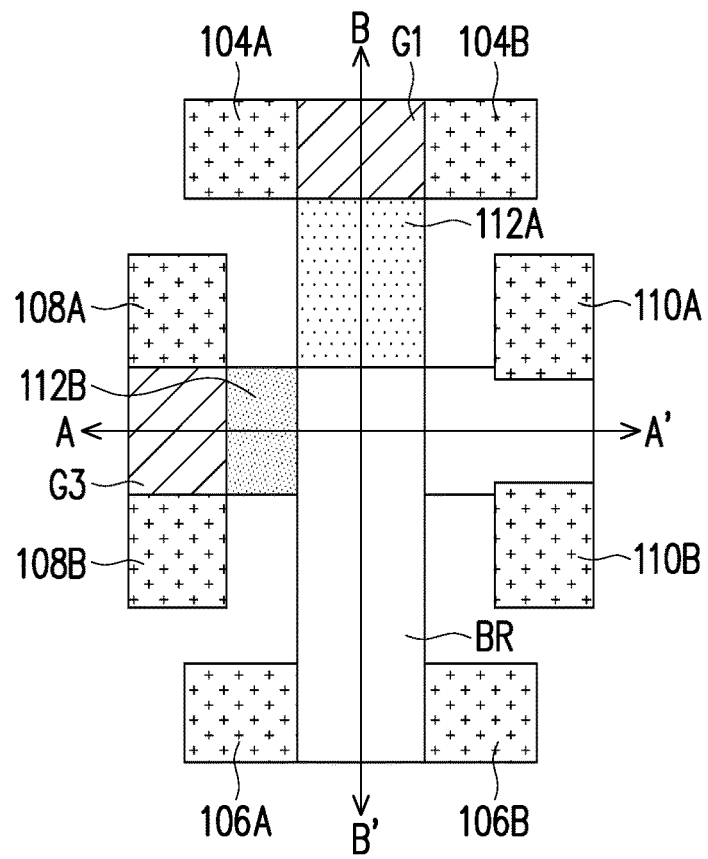
Figure 16B:
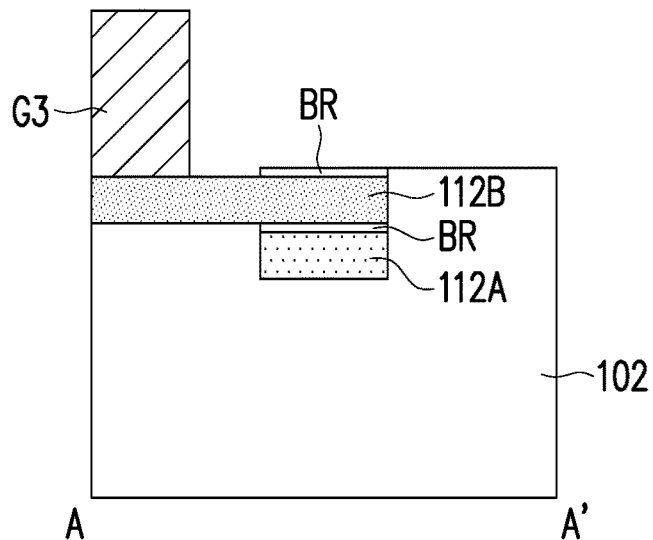
Figure 16C:
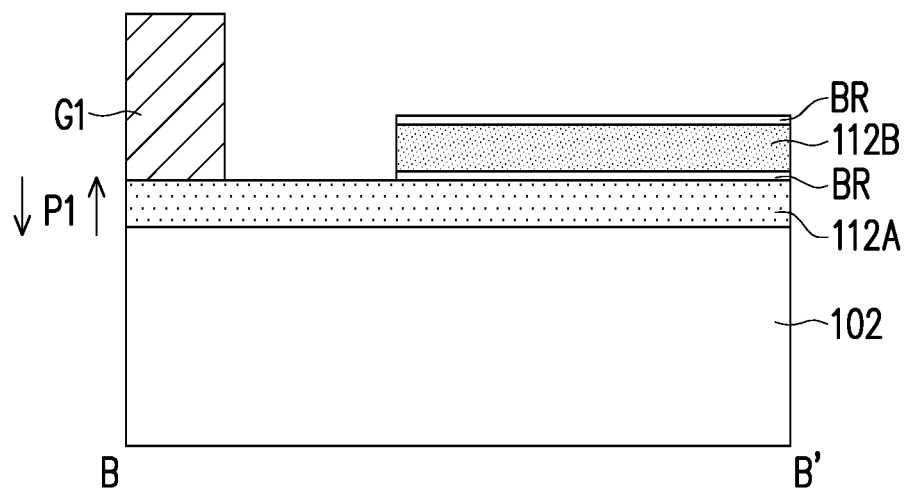

FIG. 16A is a top view of one stage in a method of fabricating a semiconductor device according to some embodiments of the present disclosure. FIG. 16B is a sectional view of the structure shown in FIG. 16A taken along the line A-A'. FIG. 16C is a sectional view of the structure shown in FIG. 16A taken along the line B-B. Referring to FIG. 16A to FIG. 16C, after forming the third gate G3, another barrier layer BR (second barrier layer) is formed over the second dielectric layer 112B (or second ferroelectric material layer 112B) to cover portions of the second dielectric layer 112B. For example, the barrier layer BR is a non-ferroelectric barrier layer, and the barrier layer BR prevents the polarization in the second dielectric layer 112B (or second ferroelectric material layer 112B) from extending into another ferroelectric material layer. In some embodiments, the barrier layer BR (second barrier layer) overlaps with the second dielectric layer 112B, the barrier layer BR (first barrier layer), and the first dielectric layer 112A.

Figure 17A:
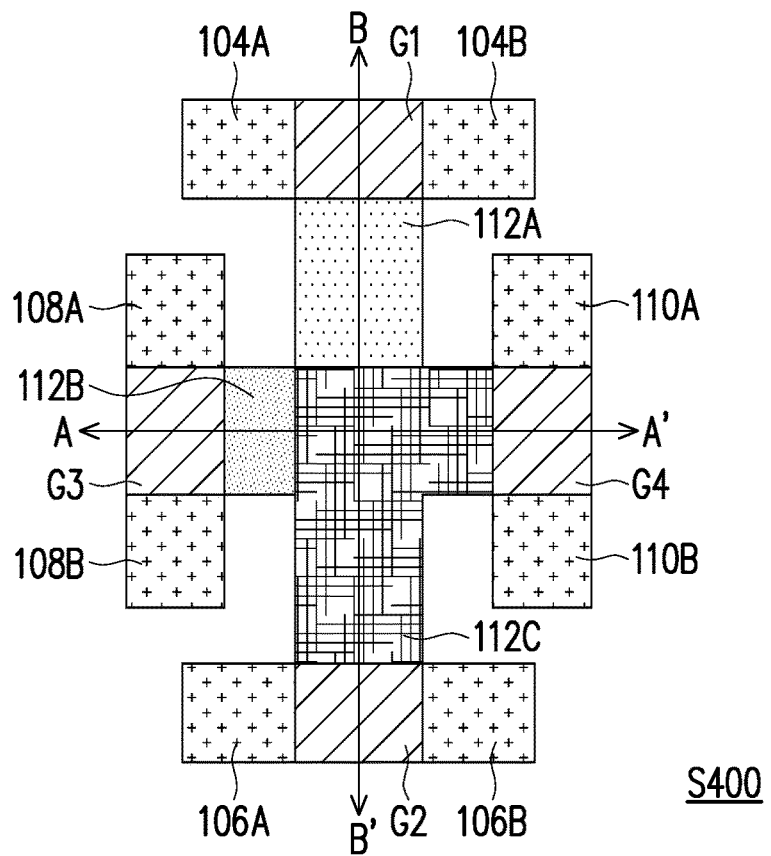
Figure 17B:
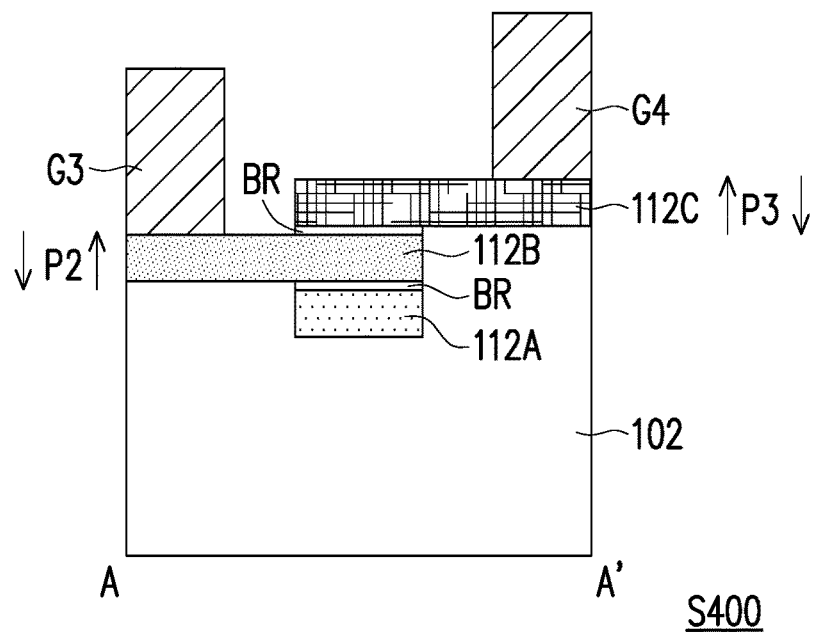
Figure 17C:
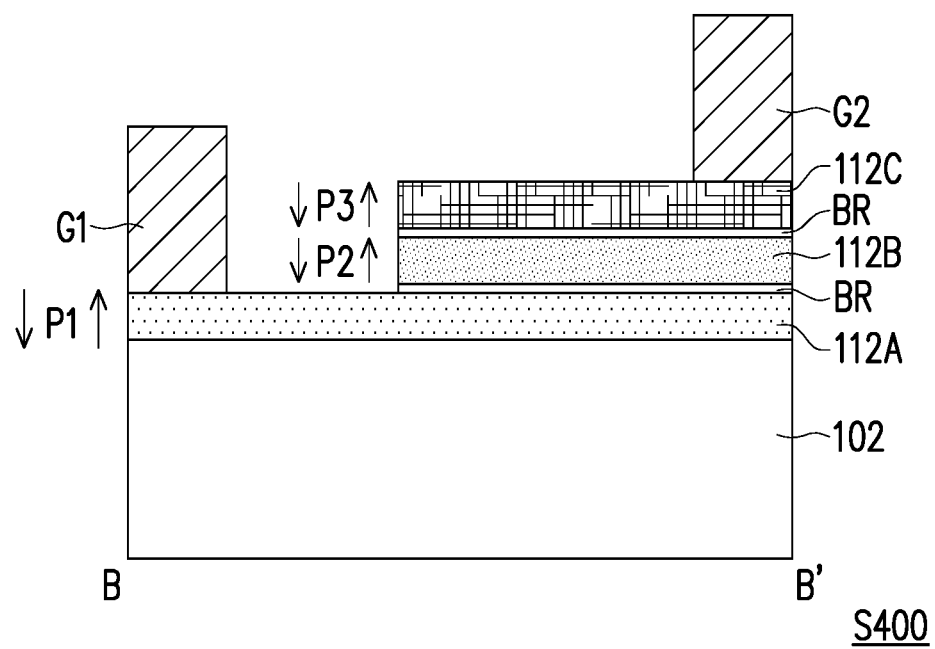

FIG. 17A is a top view of one stage in a method of fabricating a semiconductor device according to some embodiments of the present disclosure. FIG. 17B is a sectional view of the structure shown in FIG. 17A taken along the line A-A'. FIG. 17C is a sectional view of the structure shown in FIG. 17A taken along the line B-B. Referring to FIG. 17A to FIG. 17C, after forming the barrier layer BR (second barrier layer), a third dielectric layer 112C (or third ferroelectric material layer 112C) is formed on the barrier layer BL and over the substrate 102. The third dielectric layer 112C may extend across the substrate 102, and is located between the second source region 106A and the second drain region 106B, and located between the fourth source region 110A and the fourth drain region 110B. In some embodiments, the third dielectric layer 112C is arranged in a L-shaped manner when seen from the top view. In some embodiments, the third dielectric layer 112C is overlapped with the second dielectric layer 112B, the first dielectric layer 112A and overlapped with the barrier layers BR. In certain embodiments, the barrier layer BR (second barrier layer) physically separates the second dielectric layer 112B from the third dielectric layer 112C. In other words, the barrier layer BR (second barrier layer) prevents the polarization in the third dielectric layer 112C and the polarization of the second dielectric layer 112B from extending into one another.

In some embodiments, the third dielectric layer 112C (or third ferroelectric material layer 112C) includes a single-crystalline ferroelectric material. In other words, the third dielectric layer 112C (or third ferroelectric material layer 112C) is monolithically deposited/formed (i.e. in a single-crystalline manner) on the substrate 102. In various embodiments, the third dielectric layer 112C may include ferroelectric materials such as silicon doped hafnium oxide (Si:$HfO_2$), aluminum scandium nitride (AlScN), hafnium zirconium oxide ($HfZrO_2$), or the like. The type of ferroelectric materials used for the third dielectric layer 112C (or third ferroelectric material layer 112C) is not particularly limited, as long as the ferroelectric material can be deposited on the substrate 102 in a single-crystalline manner. Furthermore, the third dielectric layer 112C may be formed on the substrate 102 and over the barrier layer BR through suitable deposition techniques, such as atomic layer deposition (ALD), chemical vapor deposition (CVD), plasma enhanced chemical vapor deposition (PECVD), sputtering or the like.

In some embodiments, a material of the third dielectric layer 112C and the materials of the first dielectric layer 112A and the second dielectric layer 112B may be the same or different. The disclosure is not limited thereto. Similarly, the thicknesses and doping concentration of materials of the first dielectric layer 112A, the second dielectric layer 112B and the third dielectric layer 112C is not particularly limited, and may be appropriately adjusted based on design requirements.

As illustrated in FIG. 17A to FIG. 17C, after forming the third dielectric layer 112C (or third ferroelectric material layer 112C), a second gate G2 is formed along with a fourth gate G4 over the third dielectric layer 112C (or third ferroelectric material layer 112C). A method of forming the second gate G2 and the fourth gate G4 is the same as the method of forming the first gate G1 as described in previous embodiments. Therefore, its detailed description is omitted herein. Furthermore, a material of the second gate G2 and the fourth gate G4 may be similar to a material of the first gate G1. After forming the second gate G2 and the fourth gate G4, a semiconductor device S400 according to some exemplary embodiments of the disclosure is accomplished.

In some embodiments, the semiconductor device S400 may be referred as a majority gate transistor device (or three-bit adder transistor device).

In the semiconductor device S400 of the illustrated embodiment, the first gate G1 is disposed on the first dielectric layer 112A in between the first source region 104A and the first drain region 104B (a first transistor), the second gate G2 is disposed on the first dielectric layer 112A, the second dielectric layer 112B and on the third dielectric layer 112C in between the second source region 106A and the second drain region 106B (a second transistor), the third gate G3 is disposed on the second dielectric layer 112B in between the third source region 108A and the third drain region 108B (a third transistor), whereas the fourth gate G4 is disposed on the third dielectric layer 112C in between the fourth source region 110A and the fourth drain region 110B (a fourth transistor).

In some embodiments, the first dielectric layer 112A (first ferroelectric material layer 112A) extends from a position below the first gate G1 to a position below the second gate G2. In other words, the first dielectric layer 112A (first ferroelectric material layer 112A) is a continuous layer shared between the first gate G1 and the second gate G2. In some embodiments, the second dielectric layer 112B (second ferroelectric material layer 112B) extends from a position below the third gate G3 to a position below the second gate G2. In other words, the second dielectric layer 112B (second ferroelectric material layer 112B) is a continuous layer shared between the third gate G3 and the second gate G2. Furthermore, the third dielectric layer 112C (third ferroelectric material layer 112C) extends from a position below the fourth gate G4 to a position below the second gate G2. In other words, the third dielectric layer 112C (third ferroelectric material layer 112C) is a continuous layer shared between the fourth gate G3 and the second gate G2.

In the exemplary embodiment, the first dielectric layer 112A (first ferroelectric material layer) extends from the first gate G1 to the second gate G2 so that a polarization switching function of the first dielectric layer 112A is shared between the first gate G1 and the second gate G2. Furthermore, the second dielectric layer 112B (second ferroelectric material layer 112B) extends from the third gate G3 to the second gate G2 so that a polarization switching function of the second dielectric layer 112B is shared between the third gate G3 and the second gate G2. Similarly, the third dielectric layer 112C (third ferroelectric material layer 112C) extends from the fourth gate G4 to the second gate G2 so that a polarization switching function of the third dielectric layer 112C is shared between the fourth gate G4 and the second gate G2. In some embodiment, the first transistor (with the first gate G1), the third transistor (with the third gate G3) and the fourth transistor (with the fourth gate G4) respectively write the polarization of their respective dielectric layer in one of the two stable states (P1, P2, P3 up or down). Furthermore, the second transistor (with the second gate G2) reads out a sum of the polarizations of the first dielectric layer 112A, the second dielectric layer 112B and the third dielectric layer 112C by detecting a change in the threshold voltage.

In the exemplary embodiment, the semiconductor device S400 can be used to store at least four different states. For example, a first state is where the polarization of the first, second and third dielectric layers 112A, 112B, 112C are all written "down" (P1, P2 and P3 down); a second state is where the polarization of the first, second and third dielectric layers 112A, 112B, 112C are all written "up" (P1 up and P2 up); a third state is where two of the first, second and third dielectric layers 112A, 112B, 112C are written "up" while one is written "down" (P1, P2, P3; 2 up, 1 down); and a fourth state is where two of the first, second and third dielectric layers 112A, 112B, 112C are written "down" while one is written "up" (P1, P2, P3; 2 down, 1 up). By using the first dielectric layer 112A (first ferroelectric material layer), the second dielectric layer 112B (second ferroelectric material layer 112B) and the third dielectric layer 112C (third ferroelectric material layer 112C) for the read/write operation of the semiconductor device S400, fast write and read out times may be achieved. Furthermore, the semiconductor device S400 may act like a majority gate at specific reading voltages.

Figure 18A:
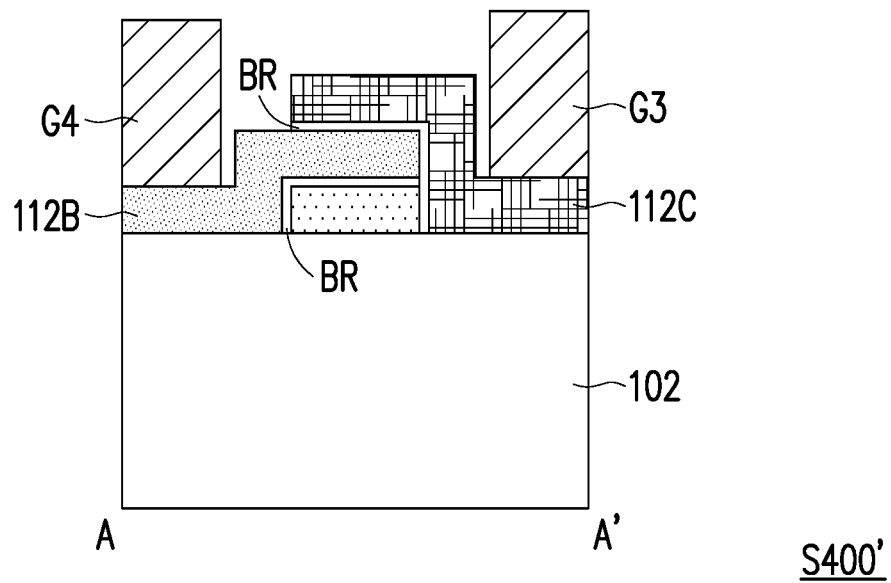
FIG. 18A and FIG. 18B are schematic sectional views of a semiconductor device according to some other embodiments of the present disclosure.
Figure 18B:
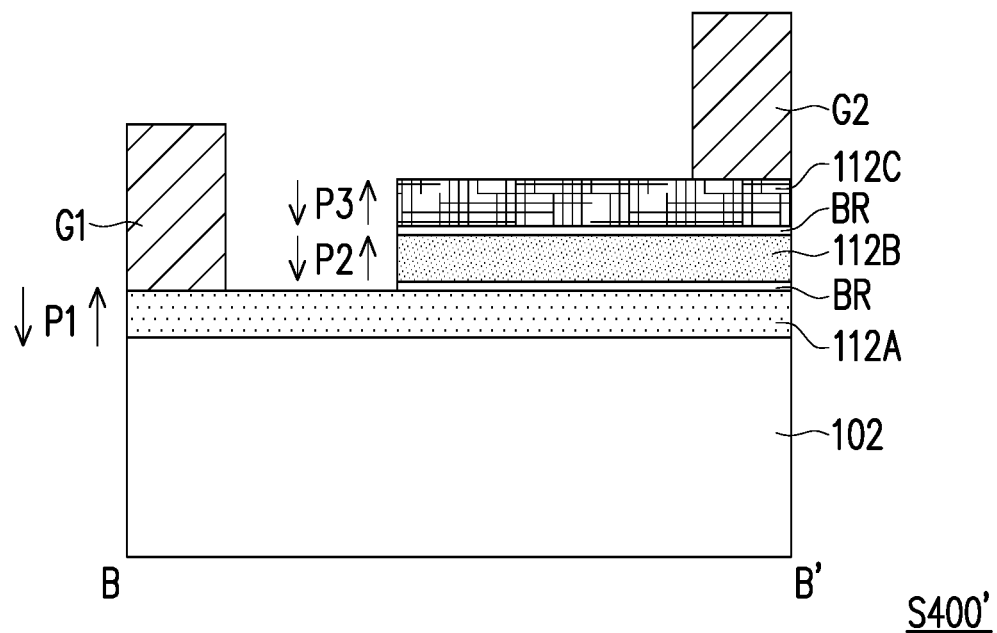

FIG. 18A and FIG. 18B are schematic sectional views of a semiconductor device according to some other embodiments of the present disclosure. The semiconductor device S400' illustrated in FIG. 18A and FIG. 18B is similar to the semiconductor device S400 illustrated in FIG. 17A to FIG. 17C. Therefore, the same reference numerals are used to refer to the same or liked parts, and its detailed description is omitted herein. In the previous embodiments, the substrate 102 may be recessed to from recessed portions Rc, whereby the first dielectric layer 112A and the second dielectric layer 112B are respectively formed in the recessed portion Rc of the substrate 102. However, the disclosure is not limited thereto.

For example, as illustrated in FIG. 18A and FIG. 18C, in some embodiments, the substrate 102 is not recessed, and the first dielectric layer 112A, the barrier layer BR (first barrier layer), the second dielectric layer 112B, the barrier layer BR (second barrier layer), and the third dielectric layer 112C may be sequentially formed over the planar substrate 102. In other words, the barrier layer BR (first barrier layer) is conformally formed over portions of the first dielectric layer 112A and is in physical contact with the first dielectric layer 112A and the substrate 102. The second dielectric layer 112B is conformally formed over the barrier layer BR and the substrate 102, and is in physical contact with the barrier layer BR and the substrate 102. The barrier layer BR (second barrier layer) is conformally formed over portions of the second dielectric layer 112B and is in physical contact with the second dielectric layer 112B and the substrate 102. The barrier layer BR (second barrier layer) further covers sidewalls of the second dielectric layer 112B, the barrier layer BR (first barrier layer) and the first dielectric layer 112A. Furthermore, the third dielectric layer 112C is conformally formed over the barrier layer BL (second barrier layer) and the substrate 102, and is in physical contact with the barrier layer BR (second barrier layer) and the substrate 102.

Similar to the above embodiments, by using the first dielectric layer 112A (first ferroelectric material layer), the second dielectric layer 112B (second ferroelectric material layer 112B) and the third dielectric layer 112C (third ferroelectric material layer 112C) for the read/write operation of the semiconductor device S400', fast write and read out times may be achieved. Furthermore, the semiconductor device S400' may act like a majority gate at specific reading voltages.

In the above-mentioned embodiments, the semiconductor device includes at least one dielectric layer (a ferroelectric material layer) shared between two gates. Since the dielectric layer is a single-crystalline ferroelectric material, the domain wall separating domains with two different polarization states may propagate through the entire dielectric layer with the speed of sound. In other words, by using such monolithically deposited dielectric layer for the read/write operation of the semiconductor device, fast write and read out times can be achieved. Furthermore, a semiconductor device that function like a majority gate can be easily implemented using such phenomenon. In addition, unlike in spin logic devices that rely on propagation of magnetic states, the semiconductor devices of the exemplary embodiments can operate at room temperature. Furthermore, a spin device would require separate magnetic/electric transduction, while electronic/ferroelectric transduction comes for free by the electronic nature of ferroelectricity.

In accordance with some embodiments of the present disclosure, a semiconductor device includes a semiconductor substrate, a first source region, a first drain region, a first gate, a second source region, a second drain region, a second gate, and a first dielectric layer. The first source region and the first drain region are disposed within the semiconductor substrate. The first gate is disposed over the semiconductor substrate in between the first source region and the first drain region. The second source region and the second drain region are disposed within the semiconductor substrate. The second gate is disposed over the semiconductor substrate in between the second source region and the second drain region. The first dielectric layer is located in between the first gate and the semiconductor substrate, and in between the second gate and the semiconductor substrate, wherein the first dielectric layer extends from a position below the first gate to a position below the second gate.

In accordance with some other embodiments of the present disclosure, a semiconductor device includes a semiconductor substrate, a first ferroelectric material layer, a first gate, a second gate, a plurality of source and drain regions and isolation structures. The semiconductor substrate has active regions and non-active regions. The first ferroelectric material layer is disposed on the active regions of the semiconductor substrate. The first gate is disposed on and in contact with the first ferroelectric material layer. The second gate is disposed over the first ferroelectric material layer, wherein the first ferroelectric material layer extends from the first gate to the second gate so that a polarization switching function of the first ferroelectric material layer is shared between the first gate and the second gate. The plurality of source and drain regions is disposed within the active regions of the semiconductor substrate and located aside the first gate and the second gate. The isolation structures are disposed within the non-active regions of the semiconductor substrate in between the plurality of source and drain regions.

In accordance with yet another embodiment of the present disclosure, a method of fabricating a semiconductor device is described. The method includes the following steps. A semiconductor substrate is doped to form a plurality of source and drain regions. A first ferroelectric material layer is monolithically formed on the semiconductor substrate. A first gate is formed to be disposed on and in contact with the first ferroelectric material layer. A second gate is formed over the first ferroelectric material layer and over the semiconductor substrate, wherein the first ferroelectric material layer extends from the first gate to the second gate so that a polarization switching function of the first ferroelectric material layer is shared between the first gate and the second gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a semiconductor substrate;
a first source region and a first drain region disposed within the semiconductor substrate;
a first gate disposed over the semiconductor substrate in between the first source region and the first drain region;
a second source region and a second drain region disposed within the semiconductor substrate;
a second gate disposed over the semiconductor substrate in between the second source region and the second drain region;
a first dielectric layer located in between the first gate and the semiconductor substrate, and in between the second gate and the semiconductor substrate, wherein the first dielectric layer extends from a position below the first gate to a position below the second gate;
a third source region and a third drain region disposed within the semiconductor substrate;
a third gate disposed over the semiconductor substrate in between the third source region and the third drain region; and
a second dielectric layer located in between the second gate and the semiconductor substrate, and in between the third gate and the semiconductor substrate, wherein the second dielectric layer extends from a position below the second gate to a position below the third gate.

2. The semiconductor device according to claim 1, wherein the first dielectric layer includes a single-crystalline ferroelectric material.

3. The semiconductor device according to claim 1, further comprising isolation structures disposed within the semiconductor substrate, wherein the isolation structures separate the first source region and the first drain region from the second source region and the second drain region.

4. The semiconductor device according to claim 1, wherein the second dielectric layer is located above the first dielectric layer, and the semiconductor device further comprises a barrier layer separating the second dielectric layer from the first dielectric layer.

5. The semiconductor device according to claim 1, wherein a thickness of the first dielectric layer is different from a thickness of the second dielectric layer.

6. The semiconductor device according to claim 1, further comprising:
a fourth source region and a fourth drain region disposed within the semiconductor substrate;
a fourth gate disposed over the semiconductor substrate in between the fourth source region and the fourth drain region; and
a third dielectric layer located in between in between the second gate and the semiconductor substrate, and in between the fourth gate and the semiconductor substrate, wherein the third dielectric layer extends from a position below the second gate to a position below the fourth gate.

7. The semiconductor device according to claim 6, wherein the third dielectric layer is located above the first dielectric layer and the second dielectric layer, and the semiconductor device further comprises a barrier layer separating the second dielectric layer from the third dielectric layer.

8. The semiconductor device according to claim 1, wherein the first dielectric layer extends in a straight line directly from the position below the first gate to the position below the second gate.

9. A semiconductor device, comprising:
   a semiconductor substrate having an active region and non-active regions;
   a first ferroelectric material layer disposed on the active region of the semiconductor substrate;
   a first gate disposed on and in contact with the first ferroelectric material layer;
   a second gate disposed over the first ferroelectric material layer, wherein the first ferroelectric material layer extends from the first gate to the second gate so that a polarization switching function of the first ferroelectric material layer is shared between the first gate and the second gate;
   a second ferroelectric material layer disposed on the active region of the semiconductor substrate and partially overlapped with the first ferroelectric material layer, wherein the second gate overlaps with the first ferroelectric material layer and the second ferroelectric material layer;
   a third gate disposed over the second ferroelectric material layer, wherein the second ferroelectric material layer extends from the second gate to the third gate so that a polarization switching function of the second ferroelectric material layer is shared between the second gate and the third gate;
   a plurality of source and drain regions disposed within the active region of the semiconductor substrate and located aside the first gate the second gate and the third gate; and
   isolation structures disposed within the non-active regions of the semiconductor substrate in between the plurality of source and drain regions.

10. The semiconductor device according to claim 9, wherein the first ferroelectric material layer consists of a single-crystalline ferroelectric material.

11. The semiconductor device according to claim 9, further comprising a non-ferroelectric barrier layer sandwiched in between the first ferroelectric material layer and the second ferroelectric material layer.

12. The semiconductor device according to claim 11, wherein,
   the first ferroelectric material layer and the second ferroelectric material layer are aluminum scandium nitride (AlScN) layers, whereas the non-ferroelectric barrier layer is an aluminum nitride (AlN) layer, or
   the first ferroelectric material layer and the second ferroelectric material layer are hafnium zirconium oxide (HfZrO$_2$) layers, whereas the non-ferroelectric barrier layer is a hafnium oxide (HfO$_2$) layer.

13. The semiconductor device according to claim 9, wherein the second gate and the third gate are disposed on a same surface of the second ferroelectric material layer and are contacting the second ferroelectric material layer.

14. The semiconductor device according to claim 9, further comprising:
   a third ferroelectric material layer disposed on the active region of the semiconductor substrate and partially overlapped with the first ferroelectric material layer and the second ferroelectric material layer, wherein the second gate further overlaps with the third ferroelectric material layer; and
   a fourth gate disposed over the third ferroelectric material layer, wherein the third ferroelectric material layer extends from the second gate to the fourth gate so that a polarization switching function of the third ferroelectric material layer is shared between the second gate and the fourth gate, and
   wherein the second gate reads out a sum of the polarizations of the first ferroelectric material layer, the second ferroelectric material layer and the third ferroelectric material layer.

15. The semiconductor device according to claim 14, wherein the second gate and the fourth gate are disposed on a same surface of the third ferroelectric material layer and are contacting the third ferroelectric material layer, and the third gate is disposed on and contacting the second ferroelectric material layer.

16. The semiconductor device according to claim 9, wherein the second ferroelectric material layer is formed in a L-shaped manner from a top view.

17. A method of fabricating a semiconductor device, comprising:
   providing a semiconductor substrate having an active region and non-active regions;
   doping the semiconductor substrate to form a plurality of source and drain regions within the active region of the semiconductor substrate;
   monolithically forming a first ferroelectric material layer on the active region of the semiconductor substrate;
   forming a first gate disposed on and in contact with the first ferroelectric material layer;
   monolithically forming a second ferroelectric material layer on the active region of the semiconductor substrate and partially overlapped with the first ferroelectric material layer;
   forming a second gate over the first ferroelectric material layer and the second ferroelectric material layer, and over the semiconductor substrate, wherein the first ferroelectric material layer extends from the first gate to the second gate so that a polarization switching function of the first ferroelectric material layer is shared between the first gate and the second gate;
   forming a third gate over the second ferroelectric material layer, wherein the second ferroelectric material layer extends from the second gate to the third gate so that a polarization switching function of the second ferroelectric material layer is shared between the second gate and the third gate; and
   patterning the semiconductor substrate and forming isolation structures within the non-active regions of the semiconductor substrate in between the plurality of source and drain regions.

18. The method according to claim 17, further comprising forming a non-ferroelectric barrier layer over the first ferroelectric material layer prior to forming the second ferroelectric material layer, and wherein the non-ferroelectric barrier layer separates the first ferroelectric material layer from the second ferroelectric material layer.

19. The method according to claim 17, further comprising:
   monolithically forming a third ferroelectric material layer on the semiconductor substrate and over portions of the first ferroelectric material layer and the second ferroelectric layer prior to forming the second gate; and forming the second gate along with a fourth gate over the third ferroelectric material layer, wherein the third ferroelectric material layer is formed to extend from the second gate to the fourth gate so that a polarization switching function of the third ferroelectric material layer is shared between the second gate and the fourth gate.

20. The method according to claim 19, further comprising forming non-ferroelectric barrier layers separating the first ferroelectric material layer from the second ferroelectric material layer, and separating the second ferroelectric material layer from the third ferroelectric material layer.

\* \* \* \* \*